(12) United States Patent
Marakhtanov et al.

(10) Patent No.: US 12,362,159 B2
(45) Date of Patent: Jul. 15, 2025

(54) SYSTEMS AND METHODS FOR CONTROLLING A PLASMA SHEATH CHARACTERISTIC

(71) Applicant: Lam Research Corporation, Fremont, CA (US)

(72) Inventors: Alexei M. Marakhtanov, Albany, CA (US); James Eugene Caron, Tracy, CA (US); John Patrick Holland, San Jose, CA (US); Felix Leib Kozakevich, Sunnyvale, CA (US); Ranadeep Bhowmick, San Jose, CA (US); Bing Ji, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 286 days.

(21) Appl. No.: 18/011,826

(22) PCT Filed: Mar. 15, 2022

(86) PCT No.: PCT/US2022/020437
§ 371 (c)(1),
(2) Date: Dec. 20, 2022

(87) PCT Pub. No.: WO2022/216419
PCT Pub. Date: Oct. 13, 2022

(65) Prior Publication Data
US 2023/0245874 A1    Aug. 3, 2023

Related U.S. Application Data

(60) Provisional application No. 63/172,019, filed on Apr. 7, 2021.

(51) Int. Cl.
    *H01J 37/32* (2006.01)

(52) U.S. Cl.
    CPC .... *H01J 37/3299* (2013.01); *H01J 37/32183* (2013.01); *H01J 2237/24564* (2013.01);
    (Continued)

(58) Field of Classification Search
    None
    See application file for complete search history.

(56) References Cited

U.S. PATENT DOCUMENTS 6,013,155 A * 1/2000 McMillin .............. C23C 16/507
                                                    216/68
6,013,984 A * 1/2000 Ellinger .............. C23C 16/4401
                                                    315/111.21
(Continued)

FOREIGN PATENT DOCUMENTS

KR    2017-0071821 A    6/2017

OTHER PUBLICATIONS

ISR & WO PCT/US2022/020437, dated Jun. 28, 2022, 10 pages.
(Continued)

*Primary Examiner* — Srinivas Sathiraju
(74) *Attorney, Agent, or Firm* — PENILLA IP, APC

(57) ABSTRACT

Systems and methods for controlling a plasma sheath characteristic are described. One of the methods includes determining a first value of the plasma sheath characteristic of a plasma sheath formed within a plasma chamber. The method further includes determining whether the first value of the plasma sheath characteristic is within a predetermined range from a preset value of the plasma sheath characteristic. The method also includes modifying a variable of a radio frequency (RF) generator coupled to the plasma chamber via an impedance matching circuit upon determining that the first value is not within the predetermined range from the preset value. The operation of modifying the variable of the RF generator is performed until it is determined that the first (Continued)

value of the plasma sheath characteristic is within the predetermined range from the preset value.

19 Claims, 7 Drawing Sheets

(52) U.S. Cl.
CPC ............... *H01J 2237/24578* (2013.01); *H01J 2237/334* (2013.01)

(56) References Cited

U.S. PATENT DOCUMENTS

| | | | | |
|---|---|---|---|---|
| 6,039,836 | A * | 3/2000 | Dhindsa | H01J 37/32642 204/298.31 |
| 6,265,831 | B1 * | 7/2001 | Howald | H03H 7/40 315/111.21 |
| 6,632,322 | B1 * | 10/2003 | Gottscho | H01J 37/3244 118/723 R |
| 6,919,689 | B2 * | 7/2005 | Jafarian-Tehrani | H01J 37/32082 324/519 |
| 7,578,258 | B2 * | 8/2009 | Fischer | C23C 16/5096 118/723 R |
| 8,186,300 | B2 * | 5/2012 | Ichino | H01J 37/32935 156/345.46 |
| 8,262,847 | B2 * | 9/2012 | Dhindsa | H01J 37/32165 156/345.44 |
| 8,343,306 | B2 * | 1/2013 | Tanaka | H01J 37/32706 118/712 |
| 8,480,913 | B2 * | 7/2013 | Ni | H01J 37/32174 156/345.28 |
| 8,563,619 | B2 * | 10/2013 | Dhindsa | H01J 37/21 204/164 |
| 10,224,183 | B1 * | 3/2019 | Shoeb | H01J 37/32146 |
| 11,158,488 | B2 * | 10/2021 | Radomski | H01J 37/32146 |
| 2002/0139477 | A1 * | 10/2002 | Ni | H01J 37/3299 156/345.44 |
| 2010/0258529 | A1 * | 10/2010 | Mori | H01J 37/32155 118/712 |
| 2011/0253673 | A1 * | 10/2011 | Ni | H01J 37/32082 156/345.28 |
| 2013/0126513 | A1 * | 5/2013 | Marakhtanov | H05B 7/18 219/383 |
| 2015/0340225 | A1 * | 11/2015 | Kim | C23C 16/455 118/728 |
| 2016/0035566 | A1 * | 2/2016 | LaVoie | C23C 16/4408 438/778 |
| 2017/0018411 | A1 * | 1/2017 | Sriraman | H01J 37/32495 |
| 2019/0057839 | A1 * | 2/2019 | Kellogg | H01J 37/32091 |
| 2019/0185999 | A1 * | 6/2019 | Shanbhag | H01J 37/3244 |
| 2019/0244788 | A1 * | 8/2019 | Marakhtanov | H01J 37/32935 |
| 2020/0118794 | A1 * | 4/2020 | Koshimizu | H01J 37/32027 |
| 2023/0245874 | A1 * | 8/2023 | Marakhtanov | H01J 37/32935 315/111.21 |

OTHER PUBLICATIONS

IEEE Transactions on Plasma Science, Shu Qin et al., "A Nonperturbing Real-Time In Situ Plasma Diagnosis Technique Using an Optical Emission Spectrometer (OES)", Aug. 2006, 8 pages.

* cited by examiner

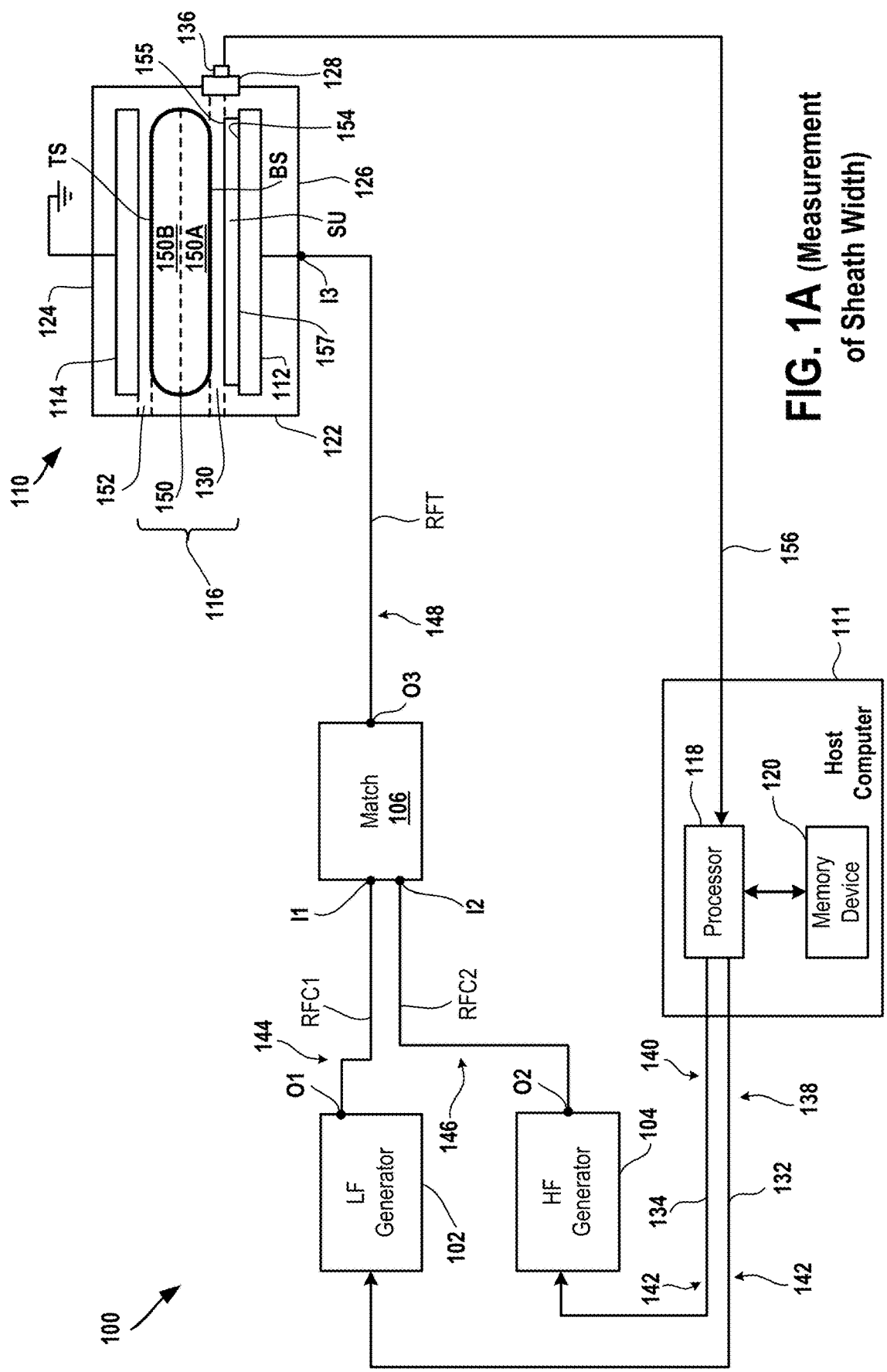
FIG. 1A (Measurement of Sheath Width)

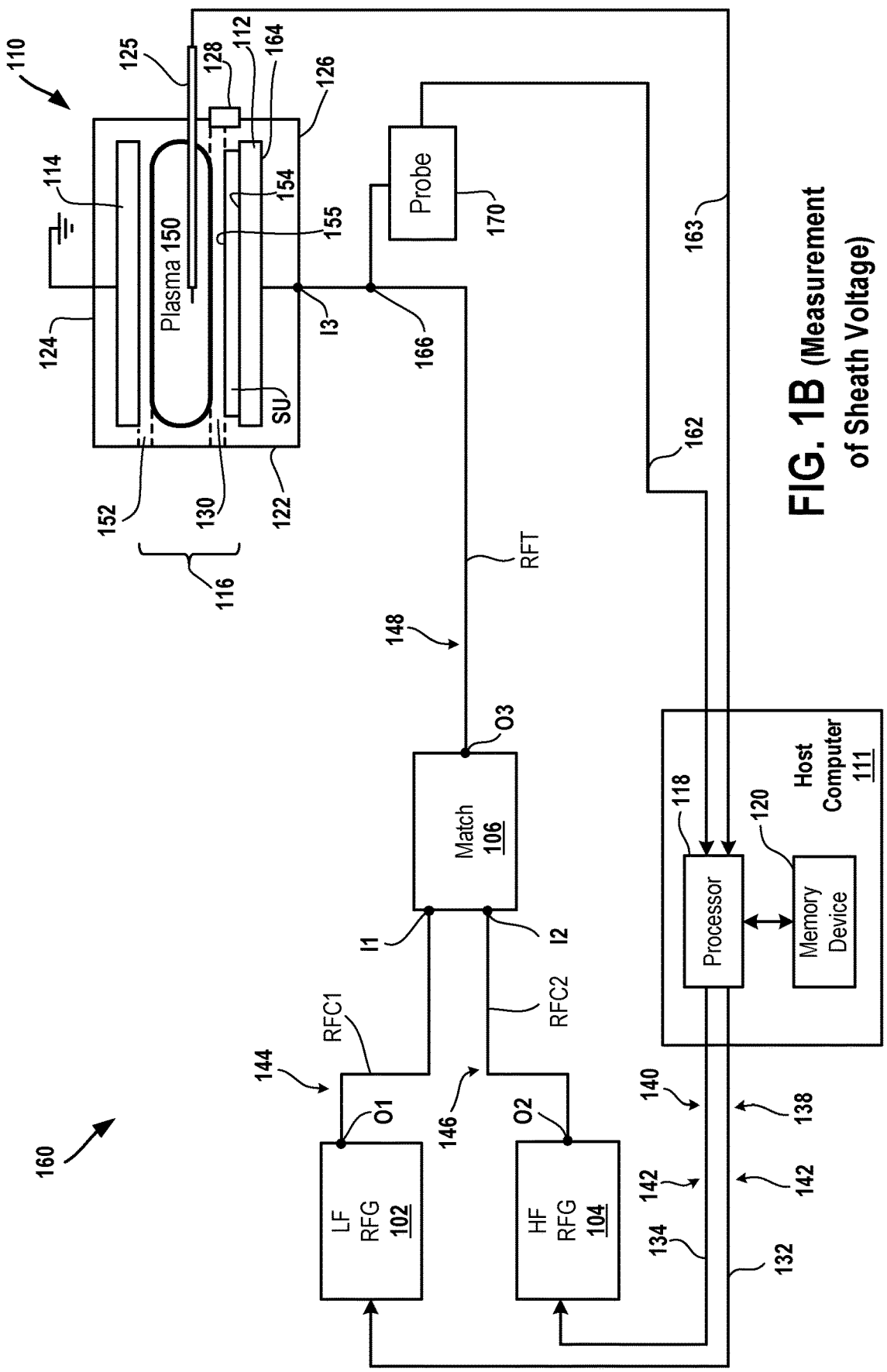
FIG. 1B (Measurement of Sheath Voltage)

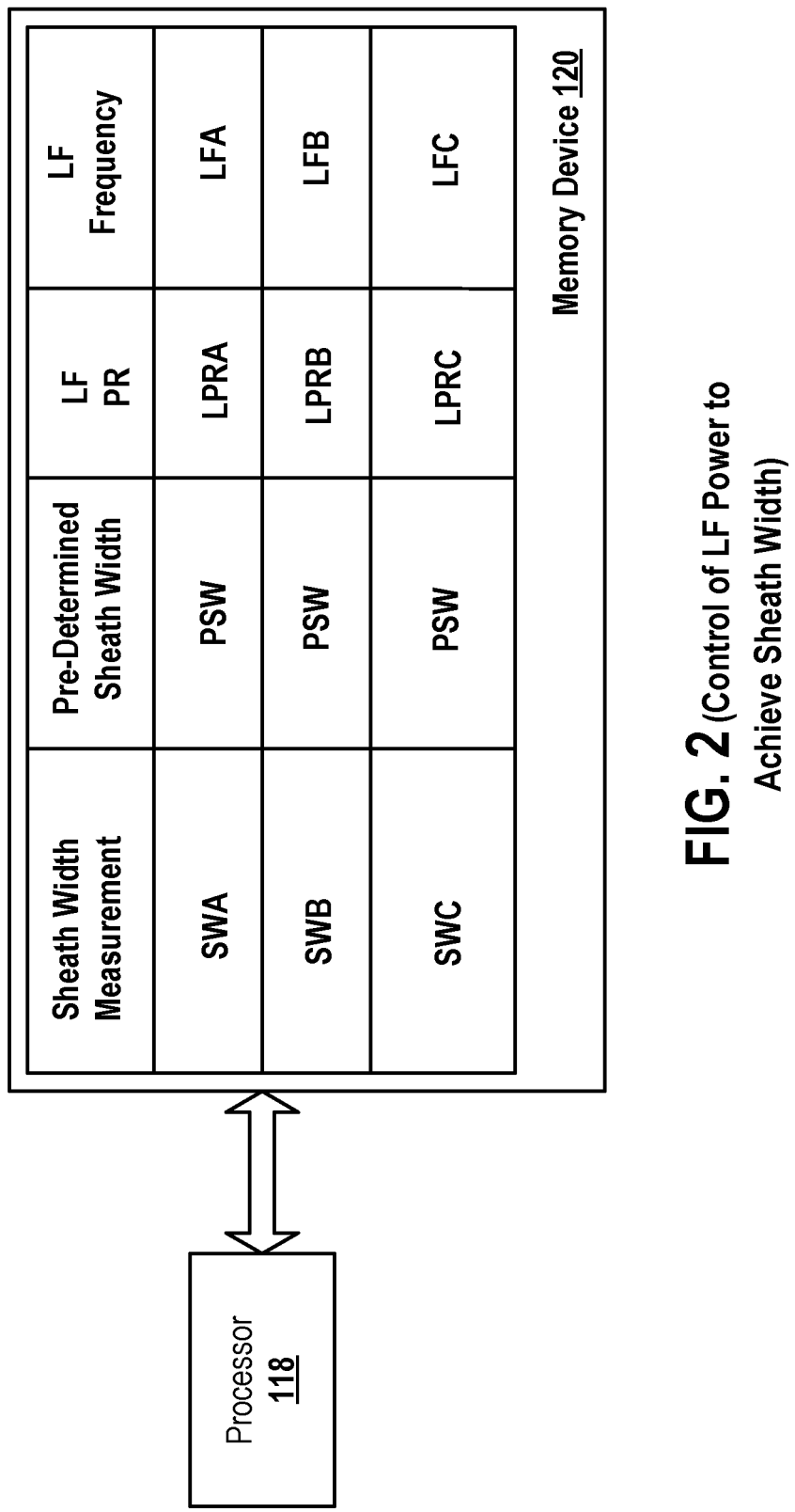
FIG. 2 (Control of LF Power to Achieve Sheath Width)

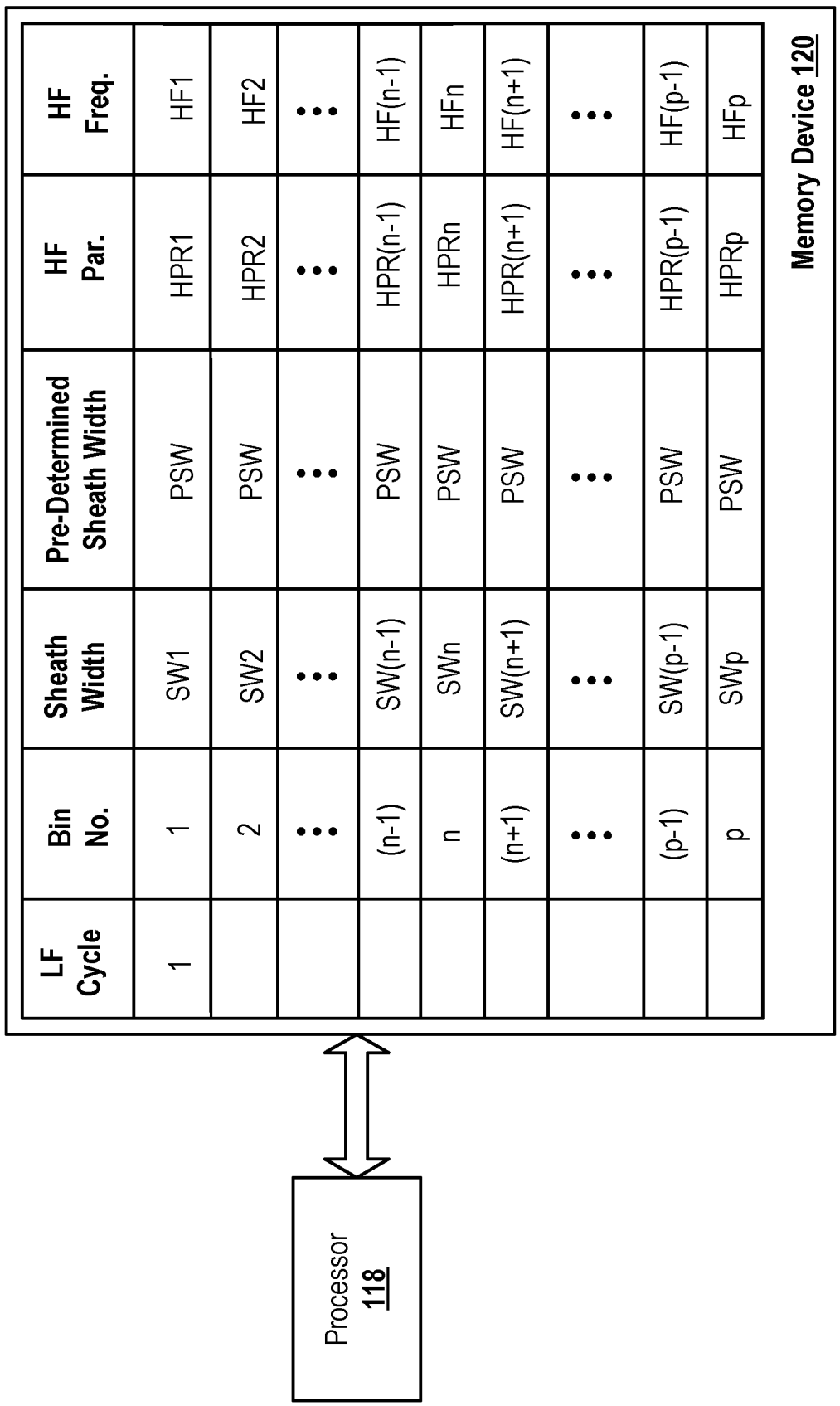
FIG. 3A (Control of HF Power to Achieve Sheath Width)

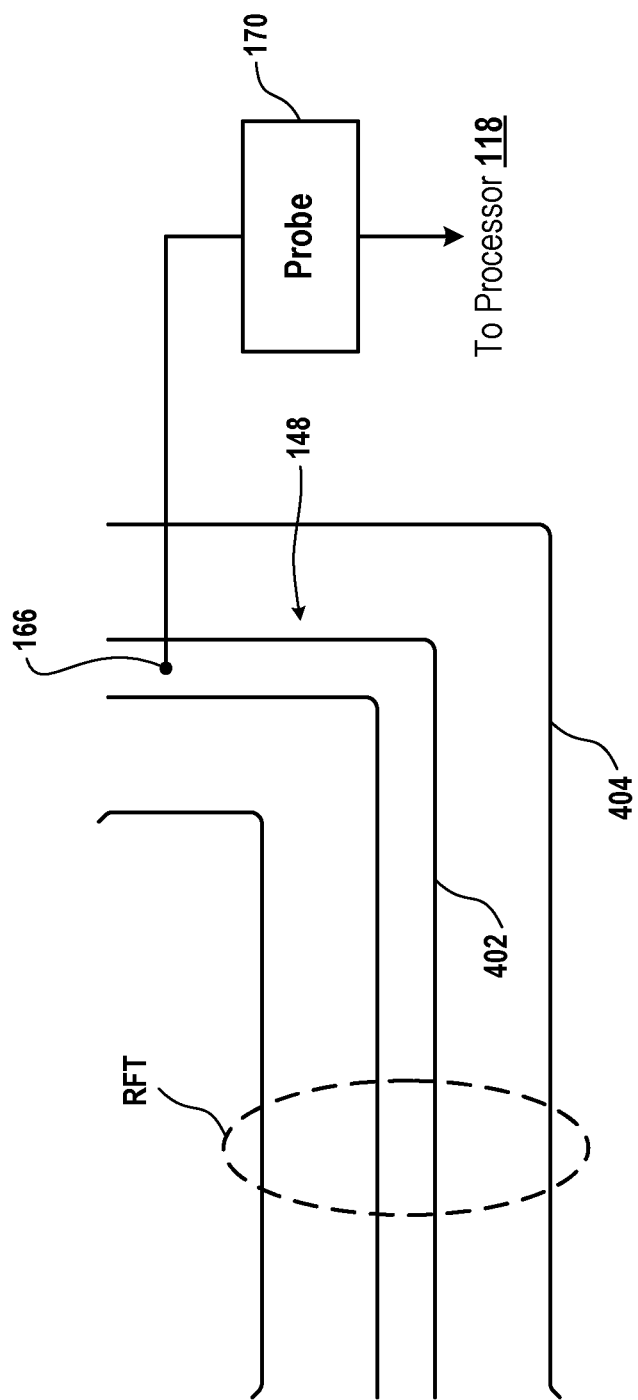
FIG. 4 (RF Transmission Line)

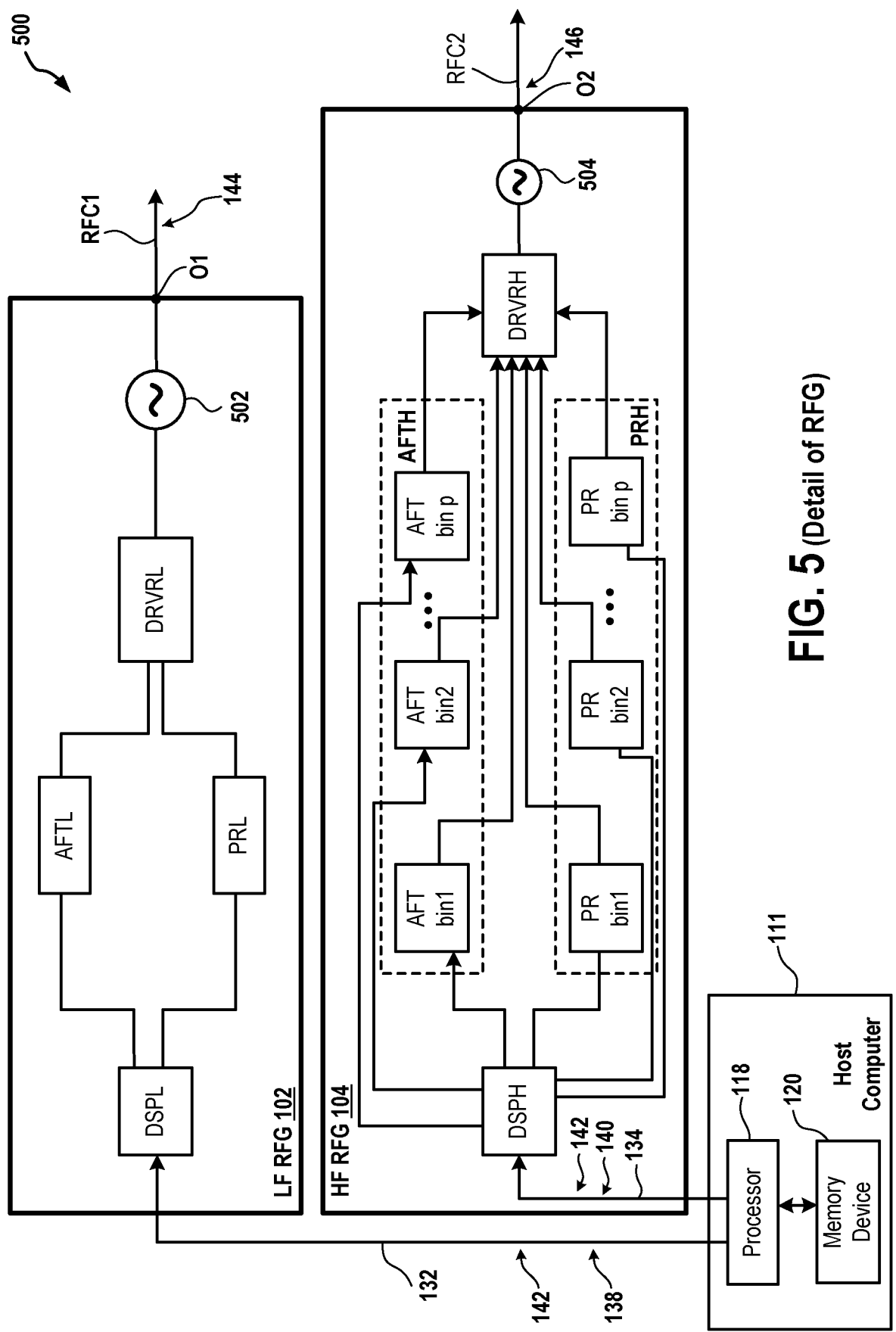
FIG. 5 (Detail of RFG)

SYSTEMS AND METHODS FOR CONTROLLING A PLASMA SHEATH CHARACTERISTIC

CLAIM OF PRIORITY

This application is a national stage filing of and claims priority, under 35 U.S.C. § 371, to PCT/US22/20437, filed on Mar. 15, 2022, and titled "SYSTEMS AND METHODS FOR CONTROLLING A PLASMA SHEATH CHARACTERISTIC", which claims the benefit of and priority, under 35 U.S.C. § 119 (e), to U.S. Provisional Patent Application No. 63/172,019, filed on Apr. 7, 2021, all of which are incorporated by reference herein in their entirety.

FIELD

The present embodiments relate to systems and methods for controlling a plasma sheath characteristic.

BACKGROUND

A plasma tool includes a radio frequency (RF) generator, an impedance matching network, and a plasma chamber. The RF generator is coupled to the impedance matching network, which is further coupled to the plasma chamber.

A semiconductor wafer is placed in the plasma chamber. An RF signal is supplied from the RF generator via the impedance matching network to the plasma chamber to process the semiconductor wafer. The substrate should be processed in an accurate manner to achieve desirable process results.

It is in this context that embodiments described in the present disclosure arise.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Embodiments of the disclosure provide systems, apparatus, methods and computer programs for controlling a plasma sheath characteristic. It should be appreciated that the present embodiments can be implemented in numerous ways, e.g., a process, an apparatus, a system, a device, or a method on a computer-readable medium. Several embodiments are described below.

One of the methods includes controlling radio frequency (RF) energy coupled into a dual frequency capacitively coupled plasma (CCP). The method provides advantages that include higher RF power efficiency, lower RF generator stress, reduced RF matching network component requirements and increased process uniformity. A CCP plasma operating with multiple frequencies, uses a low frequency (LF) for controlling ion energy and a high frequency (HF) for controlling plasma density. As the LF high voltage (HV) RF is applied to an electrode, a sheath is formed which increases and decreases in width as a magnitude and polarity of the LF RF voltage changes during each cycle of the LF RF voltage. Each cycle of the LF RF voltages is referred to herein as an LF RF cycle.

This change in the sheath width causes a change of a capacitance from the electrode to the plasma which results in a dynamically changing plasma impedance for an HF RF system. This dynamically changing plasma impedance results in poor HF RF coupling to the plasma due to a fixed tune position established by a matching network. The fixed tune position is chosen to provide a high amount of RF coupling and a low amount of reflected power as the plasma impedance is dynamically changing with the sheath width.

The matching network is tuned to an average impedance as the plasma impedance dynamically changes during each LF RF cycle. The fixed tune position is typically established using an auto tuner that locates an optimum tuning point that results in the low amount of reflected power. While the fixed tune position is optimized for the average impedance, there can exist a significant amount of reflected power due to an inability of the fixed tune position to tune to the dynamically changing impedance during each LF RF cycle. This results in a low RF power efficiency and high voltage and currents in RF components, which can increase component costs and space requirements.

The methods, described herein, facilitate coupling of HF RF power into the plasma as the plasma impedance is dynamically changing and in sync with the LF RF cycle. The methods include dynamically tuning an HF RF generator in response to a change in the sheath width during the LF RF cycle. Dynamically tuning to the change in the sheath width is accomplished by synchronizing a tune position of an HF RF generator to the LF RF voltage. The method increases the HF RF coupling to the plasma. An additional benefit of increased process uniformity can be obtained using the method by controlling an amount of HF RF power coupled into the plasma as a function of the sheath width.

Tuning of the HF RF generator during the LF RF cycle is accomplished by varying a frequency of the HF RF Generator. The change in HF RF frequency to improve tuning can be synchronized to the LF RF cycle. The change in the HF RF frequency can occur continuous or in discrete steps. The frequency of the HF RF generator is used to optimize an HF RF frequency to control the sheath width either continuously or at multiple times during each LF RF cycle.

In one embodiment, a method for controlling a plasma sheath characteristic is described. The method includes determining a first value of the plasma sheath characteristic of a plasma sheath formed within a plasma chamber. The method further includes determining whether the first value of the plasma sheath characteristic is within a predetermined range from a preset value of the plasma sheath characteristic. The method also includes modifying a variable of an RF generator coupled to the plasma chamber via an impedance matching circuit upon determining that the first value is not within the predetermined range from the preset value. The operation of modifying the variable of the RF generator is performed until it is determined that the first value of the plasma sheath characteristic is within the predetermined range from the preset value.

In an embodiment, a computer system for controlling a plasma sheath characteristic is described. The computer system includes a processor and a memory device. The processor determines a first value of the plasma sheath characteristic of a plasma sheath formed within a plasma chamber. The processor further determines whether the first value of the plasma sheath characteristic is within a predetermined range from a preset value of the plasma sheath characteristic. The processor modifies a variable of an RF generator coupled to the plasma chamber via an impedance matching circuit upon determining that the first value is not within the predetermined range from the preset value. The variable of the RF generator is modified until it is determined that the first value of the plasma sheath characteristic is within the predetermined range from the preset value. The memory device stores the preset value.

In one embodiment, a plasma system for controlling a plasma sheath characteristic is described. The plasma system includes an RF generator that generates an RF signal. The RF generator has an output. The plasma system further includes an impedance matching circuit having an input and an output. The input of the impedance matching circuit is coupled to the output of the RF generator. The plasma system includes a plasma chamber having an input. The input of the plasma chamber is coupled to the output of the impedance matching circuit. The plasma system includes a controller coupled to the RF generator. The controller determines a first value of the plasma sheath characteristic of a plasma sheath formed within the plasma chamber. The controller also determines whether the first value of the plasma sheath characteristic is within a predetermined range from a preset value of the plasma sheath characteristic. The controller modifies a variable of the RF generator upon determining that the first value is not within the predetermined range from the preset value. The variable of the RF generator is modified until it is determined that the first value of the plasma sheath characteristic is within the predetermined range from the preset value.

Some advantages of the herein described systems and methods for controlling the plasma sheath characteristic including achieving similarity in processing of multiple substrates. By controlling the plasma sheath characteristic to be within a predetermined plasma sheath characteristic, the substrates can be processed in a similar manner.

Additional advantages of the herein described systems and methods include controlling processing of the substrates based on the plasma sheath characteristic. By measuring the plasma sheath characteristic, processing of a substrate can be controlled in a more accurately compared to when factors other than the plasma sheath characteristic are measured to control the processing of the substrate. For example, a bottom plasma sheath is closest to the substrate compared to plasma. As such, a control of the bottom plasma sheath provides a more accurate control while processing the substrate compared to controlling an impedance of the plasma to process the substrate.

Further advantages of the herein described systems and methods include controlling ion flux and ion energy by controlling the plasma sheath characteristic. The ion energy and ion flux is used to achieve an etch rate. By controlling the plasma sheath characteristic, the etch rate is controlled. For example, power or frequency or both of one or more RF signals is controlled to achieve the predetermined plasma sheath characteristic. By controlling the power or frequency or both, the ion energy and ion flux are controlled to further control the etch rate.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 1A is a diagram of an embodiment of a system to illustrate a measurement of a sheath width of a bottom plasma sheath.

FIG. 1B is a diagram of an embodiment of a system to illustrate measurement of a voltage of the bottom plasma sheath.

FIG. 2 is a diagram of an embodiment of a table to illustrate a control of a variable of a low frequency (LF) radio frequency (RF) signal based on the width of the bottom plasma sheath.

FIG. 3A is a diagram of an embodiment of a table to a control of the variable of a high frequency (HF) RF signal based on the width of the bottom plasma sheath.

FIG. 4 is a diagram of an embodiment of an RF transmission line.

FIG. 5 is a diagram of an embodiment of a system to illustrate details of an LF RF generator and of an HF RF generator.

DETAILED DESCRIPTION

Figure 3B:
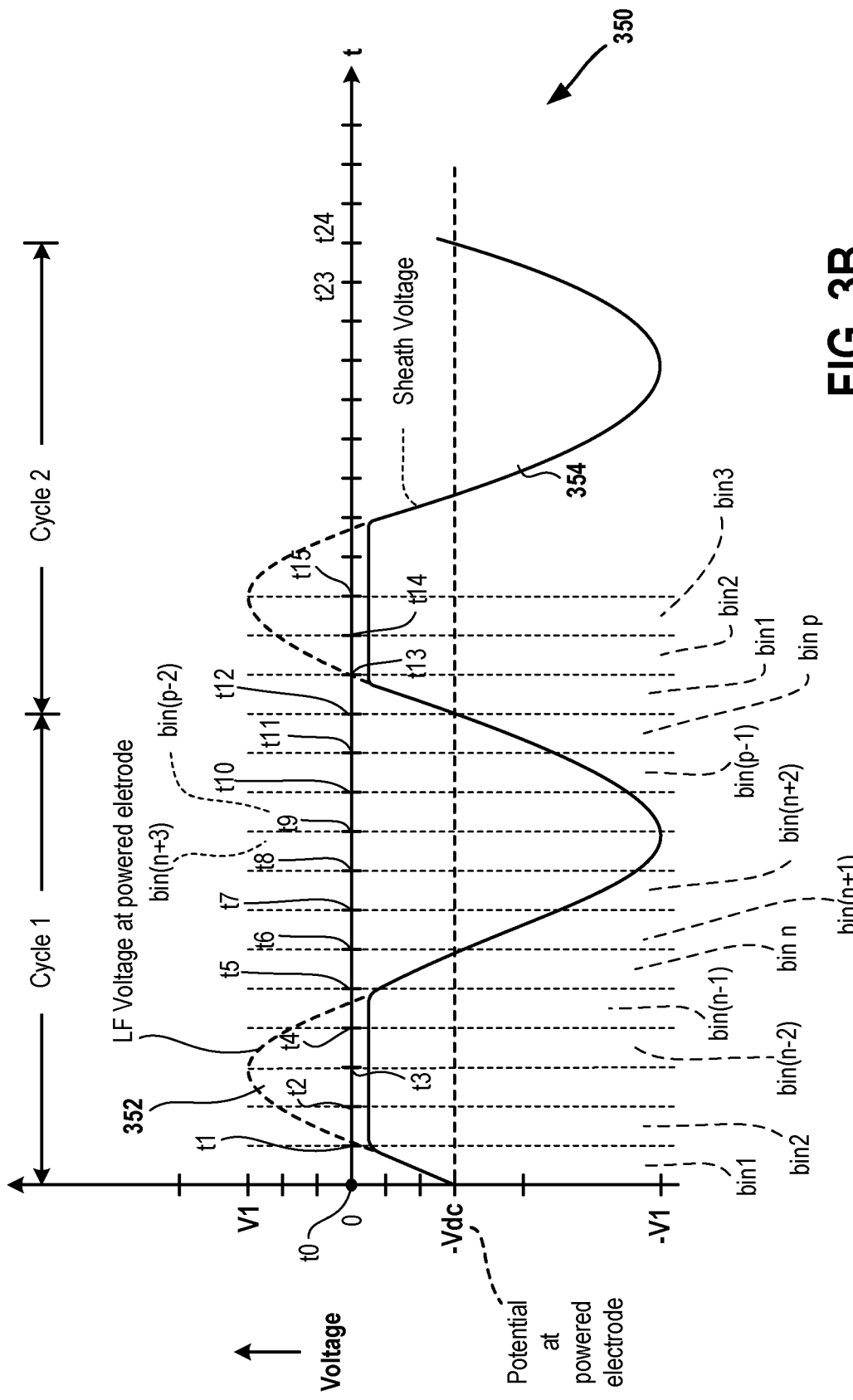
FIG. 3B is an embodiment of a graph to illustrate bins during each cycle of a parameter of the LF RF signal.

The following embodiments describe systems and methods for controlling a plasma sheath characteristic. It will be apparent that the present embodiments may be practiced without some or all of these specific details. In other instances, well known operations have not been described in detail in order not to unnecessarily obscure the present embodiments.

FIG. 1A is a diagram of an embodiment of a system 100 to illustrate a measurement of a sheath width. The system 100 includes a low frequency (LF) radio frequency (RF) generator 102, a high frequency (HF) RF generator 104, a match 106, a plasma chamber 110, and a host computer 111.

An example of the LF RF generator 102 is a generator that has an operating frequency of 400 kilohertz (kHz) or of 2 megahertz (MHz). To illustrate, the 400 kHz RF generator has a frequency tuning range between 330 kHz and 440 kHz. As another illustration, the 2 MHz RF generator has a frequency tuning range from 1 MHz to 3 MHz. An example of the HF RF generator 104 is a generator that has an operating frequency of 13.56 MHz, or 27 MHz, or 60 MHz. As an illustration, the 13.56 MHz HF RF generator has a frequency tuning range from 12 MHz to 14 MHz. As another illustration, the 60 MHz HF RF generator has a frequency tuning range from 54 MHz to 63 MHz. The operating frequency of the HF RF generator 104 is greater than the operating frequency of the LF RF generator 102. In some embodiments, an operating frequency is sometimes referred to herein as a frequency of operation.

The match 106 includes a network of circuit components, such as capacitors, inductors, and resistors. For example, the match 106 includes multiple series components and multiple shunt components. Each series component includes a capacitor, or an inductor, or a resistor, or a combination thereof. Similarly, each shunt component includes a capacitor, or an inductor, or a resistor, or a combination thereof. Each shunt component is coupled to a ground potential.

The plasma chamber 110 includes an electrostatic chuck (ESC) 112 and an upper electrode 114. As an example, the ESC 112 includes a base plate and a dielectric layer located on top of the base plate. In the example, the base plate acts as a lower electrode. As another example, the ESC 112 includes a lower electrode that is embedded within a dielectric layer, such as a ceramic layer, of the ESC 112. As an example, each of the upper electrode 114 and a lower electrode is fabricated from a metal, such as aluminum or an alloy of aluminum. The upper electrode 114 faces the ESC 112 and is located above the ESC 112 to form a gap 116 between the upper electrode 114 and the ESC 112. The upper electrode 114 is coupled to the ground potential and is an example of a counter electrode. A lower electrode is sometimes referred to herein as a powered electrode.

The plasma chamber 110 has a side wall 122, a top wall 124, and a bottom wall 126. The side wall 122 is connected to the top wall 124 and the bottom wall 126, and is located between the walls 124 and 126. Within the side wall 122 is a window 128, which is fabricated from transparent glass. As an example, the window 128 is embedded within a bottom half portion of the side wall 122. To illustrate, when a bottom plasma sheath 130 is formed within the gap 116, the window 128 faces the bottom plasma sheath 130. As a further illustration, the window 128 is fitted to the side wall 122 to face a gap between plasma 150 and a top surface 155 of a substrate SU.

An optical sensor 136 is placed adjacent to the window 128 to have a line of sight at the bottom plasma sheath 130. For example, the optical sensor 136 is attached to the window 128. As another example, the optical sensor 136 is placed on a shelf, which is attached to the side wall 122, and the shelf is below the window 128. When the optical sensor 126 is placed on the shelf, the optical sensor 136 has a line of sight via the window 128 to the bottom plasma sheath 130. For example, the optical sensor 136 has the line of sight to the bottom plasma sheath 130 and a bottom portion 150A of the plasma 150. As another example, the optical sensor 136 has the line of sight to the bottom plasma sheath 130 without having a line of sight to the bottom portion 150A of the plasma 150. The plasma 150 is illustrated as being split equally into the bottom portion 150A and a top portion 150B. The top portion 150B is located on top of the bottom portion 150A. Examples of the optical sensor 126 include a laser sensor, an optical emission spectrometer (OES), a charge-coupled device (CCD) camera, a CCD spectrometer, and an intensified CCD (ICCD) camera.

The host computer 111 includes a processor 118 and a memory device 120. Examples of a processor, as used herein, include a central processing unit, an application specific integrated circuit (ASIC), a programmable logic device (PLD), and a microprocessor. Examples of a memory device, as used herein, include a random access memory (RAM) and a read-only memory (ROM). To illustrate, a memory device is a Flash memory. The processor 118 is coupled to the memory device 120. Examples of the host computer 111 include a desktop computer, a laptop computer, a tablet, a smartphone, and a controller. To illustrate, the controller is an integrated controller that is integrated within a system-on-a-chip (SoC).

The LF RF generator 102 has an output O1 that is coupled via an RF cable RFC1 to an input I1 of the match 106. Also, the HF RF generator 104 is has an output O2 that is coupled via an RF cable RFC2 to an input I2 of the match 106. An output O3 of the match 106 is coupled via an RF transmission line RFT to an input I3 of the plasma chamber 110. An example of the input I3 is a point on an RF rod of the RF transmission line RFT. The input I3 is coupled via a portion of the RF transmission line RFT within the plasma chamber 110 to the lower electrode of the ESC 112.

The processor 118 is coupled via a transfer cable 132 to the LF RF generator 102 and is coupled via a transfer cable 134 to the HF RF generator 104. Also, the optical sensor 136 is coupled via a transfer cable 156 to the processor 118. An example of a transfer cable is a cable that transfers data in a serial manner, or a cable that transfers data in a parallel manner, or a cable that transfers data using a Universal Serial Bus (USB) protocol.

The processor 118 generates and sends a recipe signal 138 via the transfer cable 132 to the LF RF generator 102, and generates and sends a recipe signal 140 via the transfer cable 134 to the HF RF generator 104. The recipe signal 138 includes recipe information, such as power and frequency, of an LF RF signal 144 to be generated by the LF RF generator 102. Also, the recipe signal 140 includes recipe information, such as power and frequency, of an HF RF signal 146 to be generated by the HF RF generator 104. After sending the recipe signals 138 and 140, the processor 118 generates and sends a trigger signal 142 via the transfer cable 132 to the LF RF generator 102 and sends the trigger signal 142 via the transfer cable 134 to the HF RF generator 104.

In response to receiving the trigger signal 142, the LF RF generator 102 executes the recipe information received within the recipe signal 138 to generate the LF RF signal 144 having the power and frequency of the recipe information. Similarly, in response to receiving the trigger signal 142, the HF RF generator 104 executes the recipe information received within the recipe signal 140 to generate the HF RF signal 146 having the power and frequency of the recipe information. The LF RF generator 102 supplies the LF RF signal 144 via the output O1 and the RF cable RFC1 to the input I1 of the match 106. Also, the HF RF generator 104 supplies the HF RF signal 146 via the output O2 and the RF cable RFC2 to the input I2 of the match 106.

The match 106 receives the RF signals 144 and 146. When the LF RF signal 144 is sent via a first branch circuit of the match 106, an impedance of the LF RF signal 144 is modified by the first branch circuit to output a first modified RF signal. Also, when the HF RF signal 146 is sent via a second branch circuit of the match 106, an impedance of the HF RF signal 146 is modified by the second branch circuit to output a second modified RF signal. The first branch circuit includes multiple circuit components and the second branch circuit includes multiple circuit components. The input I1 is coupled to the first branch circuit and the second I2 is coupled to the second branch circuit. The first and second branch circuits are coupled to each other at the output O3.

The match 106 combines the first modified RF signal and the second modified RF signal at the output O3 to output a modified RF signal 148 at the output O3, and sends the modified RF signal 148 via the output O3, the RF rod of the RF transmission line RFT, and the input I3 to the lower electrode of the ESC 112. When one or more process gases, such as a fluorine containing gas, or an oxygen containing gas, or a combination thereof, are supplied to the gap 116 in addition to supplying the modified RF signal 148 to the lower electrode, the one or more process gases are ignited to strike the plasma 150 or continue to stay ignited to maintain the plasma 150 within the gap 116.

The plasma 150 within the gap 116 is used to process the substrate SU that is placed on top of the ESC 112 within the plasma chamber 110. Examples of processing the substrate SU include depositing materials on the substrate SU, etching the substrate SU, cleaning the substrate SU, and sputtering the substrate SU. The substrate SU is placed on a top surface 154 of the ESC 112. Examples of a substrate, as used herein, include a wafer and a semiconductor substrate, etc. To illustrate, an integrated circuit is fabricated on top of a silicon layer of the substrate.

The plasma 150 is bordered by the bottom plasma sheath 130 at or adjacent to its bottom side BS and is bordered by a top plasma sheath 152 at or adjacent to its top side TS. For example, the top plasma sheath 152 is located on top of the plasma 150 and the bottom plasma sheath 130 is located directly below the plasma 150. As another example, each plasma sheath 130 and 152 is darker in color than the plasma 150. As an example, each plasma sheath 130 and 152 includes particles, such as, positive ions and neutrals and the plasma 150 includes positive ions, neutrals, and electrons. To illustrate, the bottom plasma sheath 130 extends from the top surface 155 of the substrate SU until the plasma 150 and a sheath width of the bottom plasma sheath 130 is a distance between the top surface 155 of the substrate SU and the plasma 150. The top surface 155 of the substrate SU is not adjacent to the top surface 154 of the ESC 112 and is not in contact with the top surface 154 of the ESC 112. Rather, a bottom surface 157 of the substrate SU is in contact with and is adjacent to the top surface 154 of the ESC 154. The bottom surface 157 of the substrate SU is located in a direction opposite to the top surface 155 of the substrate SU. As an example, when there is no substrate present in the plasma chamber 110, the bottom plasma sheath 130 extends from the top surface 154 of the ESC 112 until the plasma 150 and a sheath width of the bottom plasma sheath 130 is a distance between the top surface 154 of the ESC 112 and the plasma 150.

As an illustration, each plasma sheath 130 and 152 includes a lower number of electrons than a number of electrons within the plasma 150. As another illustration, each plasma sheath 130 and 152 excludes electrons. In the illustration, the electrons of the plasma 150 are lighter than the positive ions, and therefore escape from an interface, such as a gap, between the ESC 112 and the plasma 150 to form the bottom plasma sheath 130. Continuing with the illustration, once the electrons are depleted from the interface, the bottom plasma sheath 130 having the positive ions and neutrals is formed.

After the plasma 150 is formed within the gap 116, the optical sensor 136 measures optical emission by the bottom plasma sheath 130. For example, the optical sensor 136 detects light emitted by the bottom plasma sheath 130 and the bottom portion 150A of the plasma 150 to generate an electrical signal having an optical emission profile of the bottom plasma sheath 130. The optical emission profile includes intensities of light that is emitted by the bottom plasma sheath 130 and the bottom portion 150A of the plasma 150 towards the optical sensor 136. The optical sensor 136 supplies the electrical signal via the transfer cable 156 to the processor 118. Upon receiving the electrical signal, the processor 118 generates a plot of the intensities of light versus a distance of the intensities from the top surface 155 of the substrate SU to generate an intensity profile. The processor 118 generates a first tangent to a portion of the plot generated based on intensities of light emitted by the bottom portion 150A and a second tangent to a portion of the plot generated based on intensities of light emitted by the bottom plasma sheath 130. The processor 118 further determines a point of intersection between the first tangent and the second tangent. The processor 118 determines a width of the bottom plasma sheath 130 to be a distance between the top surface 155 of the substrate SU and the point of intersection. The width of the bottom plasma sheath 130 is an example of the plasma sheath characteristic. As an example, the width, such as a thickness, of the bottom plasma sheath 130 is measured in millimeters (mm). To illustrate, the thickness of the bottom plasma sheath 130 extends from the top surface 155 of the substrate SU to the bottom portion 150A of the plasma 150.

In an embodiment, the terms match, match housing, impedance matching circuit, and impedance matching network are used herein interchangeably.

In one embodiment, the upper electrode 114 is sometimes referred to herein as a top electrode.

In an embodiment, instead of the RF transmission line RFT being coupled to the ESC 112, the RF transmission line RFT is coupled to the upper electrode 114 and the lower electrode of the ESC 112 is coupled to the ground potential. In this embodiment, the modified RF signal 148 is supplied to the upper electrode 114. In the embodiment, the upper electrode 114 is an example of a powered electrode and the base plate of the ESC 112 is an example of a counter electrode.

FIG. 1B is a diagram of an embodiment of a system 160 to illustrate measurement of an RF voltage at the plasma sheath 130 and an RF current passing through the plasma sheath 130. The system 160 is the same as the system 100 (FIG. 1A) except that in the system 160, instead of the optical sensor 136, a probe 170 is used. An example of the probe 170 includes a complex voltage and current (V&I) sensor. Further, in the system, a Langmuir probe 125 is used. The Langmuir probe 125 has a pin that extends into the plasma 150. The Langmuir probe 125 is coupled to the processor 118 via a transfer cable 163.

The probe 170 is coupled to the RF rod of the RF transmission line RFT. The probe 170 is coupled closer to the input I3 of the plasma chamber 110 compared to the output O3 of the match 106. As an example, the probe 170 is placed inside a housing of the plasma chamber 110 and coupled to a point on the RF rod of the RF transmission line. The housing of the plasma chamber 110 is formed by the walls 122, 124, and 126. As another example, the probe 170 is connected to a bottom surface 164 of the base plate of the ESC 112. The bottom surface 164 faces in a downward vertical direction and the top surface 154 of the ESC 112 faces in an upward vertical direction. As yet another example, the probe 170 is coupled to a point 166 on the RF rod of the RF transmission line RFT. The point 166 is closer to the input I3 than to the output O3 of the match 106. To illustrate, a distance between the probe 170 and the input I3 is less than a distance between the probe 170 and the output O3. The probe 170 is coupled to the processor 118 via a transfer cable 162.

When the plasma 150 is produced within the gap 116 within the plasma chamber 110, the probe 170 measures a voltage, such as a voltage signal, at the point 164 on the RF rod and provides the voltage via the transfer cable 162 to the processor 118. The voltage is an example of the plasma sheath characteristic.

The Langmuir probe 125 is placed within the plasma 150 and in proximity to the bottom plasma sheath 130 to measure ion saturation current, such as positive ion saturation current, and electron temperature at the bottom plasma sheath 130. For example, the Langmuir probe 125 is placed closer to the bottom plasma sheath 130 compared to the top plasma sheath 152. The Langmuir probe 125 provides the ion saturation current and the electron temperature via the transfer cable 163 to the processor 118.

In one embodiment, the probe 170 is coupled to the bottom surface 164 of base plate of the ESC 112 instead of being coupled to the RF rod of the RF transmission line RFT.

In an embodiment, a current-voltage probe, such as a Langmuir probe, that measures an amount of flux of the bottom plasma sheath 130 is placed within a region of the bottom plasma sheath 130. The current-voltage probe is coupled to an ammeter and a voltmeter. The ammeter and the voltmeter are coupled to the processor 118. The current-voltage probe measures an amount of flow of positive ions and neutrals within the bottom plasma sheath 130 to generate an electrical current. The electrical current is measured by the ammeter and voltage that is generated by the electrical current is measured by the voltmeter. The measurements of the voltage and the current of the bottom plasma sheath 130 are provided to the processor 118. The processor 118 calculates a capacitance of the bottom plasma sheath 130. The capacitance is calculated based on the measurement of the voltage and a total charge of an amount of particles of the bottom plasma sheath 130. As an example, the processor 118 calculates the capacitance to be a ratio of the total charge and the voltage. The total charge of the amount of particles of the bottom plasma sheath 130 is calculated by the processor 118. For example, the total charge is calculated to be equal to a one-half of a product of an amount of charge held by each positive ion and a volume of the bottom plasma sheath 130. The volume of the bottom plasma sheath 130 is calculated by the processor 118 from a width of the bottom plasma sheath 130 and a radius of the bottom plasma sheath 130. To illustrate, the volume of the bottom plasma sheath 130 is $\pi r^2 h$, where r is the radius and h is the width of the bottom plasma sheath 130. The radius of the bottom plasma sheath 130 is equal to a radius of the bottom wall 126. In the example, the plasma chamber 110 has a cylindrical shape. In the example, it is assumed that half of the bottom plasma sheath 130 includes positive ions and the remaining half of the bottom plasma sheath 130 includes neutrals. The capacitance is another example of the plasma sheath characteristic.

In one embodiment, the probe 170 measures RF current, RF voltage, and phase between the RF current and the RF voltage at the ESC 112. Also, the Langmuir probe 125 measures the temperature of electrons and the ion saturation current at the bottom plasma sheath 130. The RF current, the RF voltage, and the phase are provided from the probe 170 via the transfer cable 162 to the processor 118. Density of the bottom plasma sheath 130 is determined by the processor 118 as a function of an amount of charge of one of the positive ions of the bottom plasma sheath 130. The density is further determined based on an effective area, such as an area of the pin, of the Langmuir probe 125, the ion saturation current measured by the Langmuir probe 125, an effective ion mass of the one of the positive ions, and the temperature of the electrons at the bottom plasma sheath 130. The processor 118 determines the ion saturation current to be an amount of current received from the Langmuir probe 125 during a time period in which the voltage sensed by the probe 170 is negative. The density is another example of the plasma sheath characteristic.

In an embodiment, the processor 118 determines the thickness of the bottom plasma sheath 130 to be a function of the RF voltage, the RF current, and the phase received from the probe 170, and the ion saturation current and the electron temperature received from the Langmuir probe 125.

FIG. 2 is a diagram of an embodiment of a table 200 to illustrate a control of a variable of the LF RF signal 144 (FIG. 1A) based on the width of the bottom plasma sheath 130 (FIG. 1A). Examples of the parameter include voltage and power. Examples of the variable of the LF RF signal 144 include a parameter or frequency or a combination thereof of the LF RF signal 144. The table 200 is generated by the processor 118 and stored in the memory device 120. The table 200 is an example of a database.

The table 200 includes a listing of a width of the bottom plasma sheath 130 that is calculated by the processor 118 based on a signal received from a sensor. For example, the table 200 includes multiple values SWA, SWB, and SWC, a predetermined sheath width PSW, multiple parameter values LPRA, LPRB, and LPRC of the LF RF signal 144, and multiple frequency values LFA, LFB, and LFC of the LF RF signal 144. The predetermined sheath width is sometimes referred to herein as a preset sheath width and is a value in millimeters.

The processor 118 determines a width of the bottom plasma sheath 130 (FIG. 1A). For example, during each cycle of the parameter of the LF RF signal 144 (FIG. 1A) that is supplied by the LF RF generator 102 (FIG. 1A), the processor 118 calculates a width of the bottom plasma sheath 130. To illustrate, during a first cycle, such a cycle 1, of the parameter of the LF RF signal 144, the processor 118 receives a first electrical signal having a first optical emission profile of the bottom plasma sheath 130 from the optical sensor 136 (FIG. 1A). The processor 118 determines, from the first electrical signal, the width SWA of the bottom plasma sheath 130 from the first electrical signal. Similarly, during a second cycle, such as a cycle 2, of the parameter of the LF RF signal 144, the processor 118 receives a second electrical signal having a second optical emission profile of the bottom plasma sheath 130 from the optical sensor 136. The processor 118 determines, from the second electrical signal, the width SWB of the bottom plasma sheath 130 from the second electrical signal. Also, during a third cycle, such as a cycle 3, of the parameter of the LF RF signal 144, the processor 118 receives a third electrical signal having a third optical emission profile of the bottom plasma sheath 130 from the optical sensor 136. The third cycle is consecutive to the second cycle, which is consecutive to the first cycle. For example, there is no other cycle between the first and second cycles or between the second and third cycles. The processor 118 determines, from the third electrical signal, the width SWC of the bottom plasma sheath 130 from the third electrical signal. In the illustration, the probe 170 is coupled to the point 166 (FIG. 1B) on the RF rod of the RF transmission line RFT of the system 100 (FIG. 1A). The probe 170 is also coupled to the processor 118 of the system 100 via the transfer cable 162 (FIG. 1B). The probe 170 provides the voltage signal to the processor 118 via the transfer cable 162. The processor 118 applies Fourier transform to convert the voltage signal from a time domain to a frequency domain. In the frequency domain, the processor 118 identifies a portion of the voltage signal having a frequency that lies within the frequency range of operation of the LF RF generator 102. From the portion of the voltage signal having the frequency that lies with the frequency range of operation of the LF RF generator 102, the processor 118 identifies the first through third cycles of the parameter of the LF RF signal 144. An example of the portion of the voltage signal is illustrated as a voltage signal 352 (FIG. 3B).

As another illustration, the processor 118 determines, during the first cycle of the parameter of the LF RF signal 144, the sheath width SWA as a statistical value, such as an average or a median, calculated from a first set of sheath widths. The first set of sheath widths is determined by the processor 118 from multiple electrical signals having a first set of optical emission profiles of the bottom plasma sheath 130 received from the optical sensor 136 during the first cycle of the parameter of the LF RF signal 144. Also, in the illustration, the processor 118 determines the sheath width SWB as a statistical value calculated from a second set of sheath widths. The second set of sheath widths is determined by the processor 118 from multiple electrical signals having a second set of optical emission profiles of the bottom plasma sheath 130 received from the optical sensor 136 during the second cycle of the parameter of the LF RF signal 144.

Upon determining during the first cycle of the parameter of the LF RF signal 144, that the sheath width SWA does not lie within a predetermined range from the predetermined sheath width PSW, the processor 118 changes, during the first cycle, the variable, such as the parameter or the frequency of the LF RF signal 144 or both the parameter and the frequency, to achieve the predetermined sheath width PSW. For example, in response to determining that the sheath width SWA does not lie within the predetermined range from the predetermined sheath width PSW, the processor 118 changes a parameter set point, such as a parameter value, of the recipe signal 138 (FIG. 1A) to the parameter value LPRA to achieve the predetermined sheath width PSW. To illustrate, when the parameter of the LF RF signal 144 changes from the parameter set point to the parameter value LPRA, the sheath width SWA is modified during the first cycle of the parameter of the LF RF signal 144 to be within the predetermined range from the predetermined sheath width PSW. The predetermined range is stored in the memory device 120. It should be noted that the parameter of the LF RF signal 144 is modified to modify a shape of the bottom plasma sheath 130. For example, the shape of the bottom plasma sheath 130 is similar to a shape of a peak-to-peak value of the parameter of the LF RF signal 144. To illustrate, when the shape of a peak-to-peak value of the parameter of the LF RF signal 144 is pulsed, the shape of the bottom plasma sheath 130 is pulsed. As another illustration, when the shape of a peak-to-peak value of the parameter of the LF RF signal 144 is defined by a continuous waveform, the shape of the bottom plasma sheath 130 is also defined by a continuous waveform. As another illustration, when the shape of a peak-to-peak value of the parameter of the LF RF signal 144 is defined by an arbitrary waveform, the shape of the bottom plasma sheath 130 is defined by an arbitrary waveform.

On the other hand, in response to determining, during the first cycle of the parameter of the LF RF signal 144, that the sheath width SWA lies within the predetermined range from the predetermined sheath width PSW, the processor 118 does not modify, during the first cycle, the parameter set point of the recipe signal 138 to the parameter value LPRA to achieve the predetermined sheath width PSW. To illustrate, when the parameter of the LF RF signal 144 is not changed from the parameter set point to the parameter value LPRA, the sheath width SWA is not modified during the first cycle of the parameter of the LF RF signal 144 and the sheath width SWA is within the predetermined range from the predetermined sheath width PSW.

Similarly, as another example, in response to determining, during the first cycle of the parameter of the LF RF signal 144, that the sheath width SWA does not lie within the predetermined range from the predetermined sheath width PSW, the processor 118 changes a frequency set point, such as a frequency value, of the recipe signal 138 to the frequency value LFA to achieve the predetermined sheath width PSW. To illustrate, when the frequency of the LF RF signal 144 changes from the frequency set point to the frequency value LFA, the sheath width SWA is modified during the first cycle of the parameter of the LF RF signal 144 to be within the predetermined range from the predetermined sheath width PSW.

On the other hand, in response to determining, during the first cycle of the parameter of the LF RF signal 144, that the sheath width SWA lies within the predetermined range from the predetermined sheath width PSW, the processor 118 does not modify the frequency set point of the recipe signal 138 to the frequency value LFA to achieve the predetermined sheath width PSW. To illustrate, when the frequency of the LF RF signal 144 is not changed from the frequency set point to the frequency value LFA, the sheath width SWA is not modified during the first cycle of the parameter of the LF RF signal 144 and the sheath width SWA is within the predetermined range from the predetermined sheath width PSW.

The processor 118 controls, during the first cycle of the parameter of the LF RF signal 144, the LF RF generator 102 to generate an adjusted LF RF signal having the parameter value LPRA, or the frequency value LFA, or a combination thereof to change the sheath width SWA to the predetermined sheath width PSW. For example, the processor 118 changes the parameter set point of the parameter of the RF signal 144 to the value LPRA to generate an adjust-parameter recipe signal and sends the adjust-parameter recipe signal to the LF RF generator 102. In response to receiving the adjust-parameter recipe signal having the parameter value LPRA, the LF RF generator 102 generates an adjust-parameter RF signal based on the parameter value LPRA of the adjust-parameter recipe signal and supplies the adjust-parameter RF signal having the parameter value LPRA via the RF cable RFC1 to the match 106 (FIG. 1A). Upon receiving the adjust-parameter RF signal having the parameter value LPRA and the RF signal 146, the match 106 adjusts an impedance of the adjust-parameter RF signal to output a first adjust-parameter modified RF signal. The match 106 combines the first adjust-parameter modified RF signal with the second modified RF signal, which is generated based on the RF signal 146 (FIG. 1A), to output an adjust-parameter combined RF signal and sends the adjust-parameter combined RF signal via the RF transmission line RFT to the ESC 112 to achieve the predetermined sheath width PSW. Continuing with the example, during the cycle 1 of the parameter of the LF RF signal 144, after the adjust-parameter combined RF signal is supplied to the ESC 112, the processor 118 receives a modified electrical signal indicating a modified optical emission profile of the bottom plasma sheath 130. In the example, during the cycle 1 of the parameter of the LF RF signal 144, the processor 118 determines, from the modified optical emission profile, the modified sheath width and further determines that the modified sheath width is within the predetermined range from the predetermined sheath width PSW.

As another example, the processor 118 changes the frequency set point of the frequency of the RF signal 144 to the value LFA to generate an adjust-frequency recipe signal and sends the adjust-frequency recipe signal to the LF RF generator 102. In response to receiving the adjust-frequency recipe signal having the frequency value LFA, the LF RF generator 102 generates an adjust-frequency RF signal based on the frequency value LFA of the adjust-frequency recipe signal and supplies the adjust-frequency RF signal having the frequency value LFA via the RF cable RFC1 to the match 106 (FIG. 1A). Upon receiving the adjust-frequency RF signal having the frequency value LFA and the RF signal 146, the match 106 adjusts an impedance of the adjust-frequency RF signal to output a first adjust-frequency modified RF signal. The match 106 combines the first adjust-frequency modified RF signal with the second modified RF signal, which is generated based on the RF signal 146 (FIG. 1A), to output an adjust-frequency combined RF signal and sends the adjust-frequency combined RF signal via the RF transmission line RFT to the ESC 112 to achieve the predetermined sheath width PSW. Continuing with the example, during the cycle 1 of the parameter of the LF RF signal 144, after the adjust-frequency combined RF signal is supplied to the ESC 112, the processor 118 receives a modified electrical signal indicating a modified optical emission profile of the bottom plasma sheath 130. In the example, during the cycle 1 of the parameter of the LF RF signal 144, the processor 118 determines, from the modified optical emission profile, the modified sheath width and further determines that the modified sheath width is within the predetermined range from the predetermined sheath width PSW.

As yet another example, the processor 118 changes the parameter set point of the parameter of the RF signal 144 to the value LPRA and the frequency set point of the frequency of the RF signal 144 to the value LFA to generate an adjusted recipe signal and sends the adjusted recipe signal to the LF RF generator 102. In response to receiving the adjusted recipe signal having the values LPRA and LFA, the LF RF generator 102 generates the adjusted LF RF signal based on the value LPRA and LFA of the adjusted recipe signal and supplies the adjusted LF RF signal having the values LPRA and LFA via the RF cable RFC1 to the match 106 (FIG. 1A). Upon receiving the adjusted LF RF signal having the values LPRA and LFA and the RF signal 146, the match 106 adjusts an impedance of the adjusted LF RF signal to output a first adjusted modified RF signal. The match 106 combines the first adjusted modified RF signal with the second modified RF signal, which is generated based on the RF signal 146 (FIG. 1A), to output an adjusted combined RF signal and sends the adjusted combined RF signal via the RF transmission line RFT to the ESC 112 to change the sheath width SWA to be within the predetermined range from the predetermined sheath width PSW. Continuing with the example, during the cycle 1 of the parameter of the LF RF signal 144, after the adjusted combined RF signal is supplied to the ESC 112, the processor 118 receives a modified electrical signal indicating a modified optical emission profile of the bottom plasma sheath 130. In the example, during the cycle 1 of the parameter of the LF RF signal 144, the processor 118 determines, from the modified optical emission profile, the modified sheath width and further determines that the modified sheath width is within the predetermined range from the predetermined sheath width PSW. An example of the adjusted LF RF signal is the LF RF signal 144 with a modification of a frequency or a parameter or both the parameter and the frequency of the LF RF signal 144.

In a similar manner, upon determining, during the second cycle of the parameter of the LF RF signal 144, that the sheath width SWB does not lie within the predetermined range from the predetermined sheath width PSW, the processor 118 changes the parameter value LPRA to the parameter value LPRB, or changes the frequency value LFA to the frequency value LFB, or changes the parameter value LPRA to the parameter value LPRB and the frequency value LFA to the frequency value LFB to achieve the predetermined sheath width PSW. During the second cycle of the parameter of the LF RF signal 144, the processor 118 controls the LF RF generator 102 to generate an adjusted LF RF signal having the parameter value LPRB, the frequency value LFB, or having both the values LPRB and LFB to change the sheath width SWB to be within the predetermined range from the predetermined sheath width PSW. Continuing with the example, during the cycle 2 of the parameter of the LF RF signal 144, after the adjusted LF RF signal is generated by the LF RF generator 102, the processor 118 receives a modified electrical signal indicating a modified optical emission profile of the bottom plasma sheath 130. In the example, during the cycle 2 of the parameter of the LF RF signal 144, the processor 118 determines, from the modified optical emission profile, the modified sheath width and further determines that the modified sheath width is within the predetermined range from the predetermined sheath width PSW.

On the other hand, in response to determining, during the second cycle of the parameter of the LF RF signal 144, that the sheath width SWA lies within the predetermined range from the predetermined sheath width PSW, the processor 118 does not modify the parameter value LPRA to the parameter value LPRB and does not modify frequency value LFA to the frequency value LFB. To illustrate, when the frequency value LFA of the LF RF signal 144 is not changed to the frequency value LFB and the parameter value LPRA of the LF RF signal 144 is not changed to the parameter value LPRB, the sheath width SWB is not modified during the second cycle of the parameter of the LF RF signal 144 and the sheath width SWB is within the predetermined range from the predetermined sheath width PSW.

Similarly, in response to determining, during the third cycle of the parameter of the LF RF signal 144, that the sheath width SWC does not lie within the predetermined range from the predetermined sheath width PSW, the processor 118 changes the parameter value LPRB to the parameter value LPRC, or changes the frequency value LFB to the frequency value LFC, or changes the parameter value LPRB to the parameter value LPRC and the frequency value LFB to the frequency value LFC to achieve the predetermined sheath width PSW. During the third cycle of the parameter of the LF RF signal 144, the processor 118 controls the LF RF generator 102 to generate an adjusted LF RF signal having the parameter value LPRC, the frequency value LFC, or having both the values LPRC and LFC to change the sheath width SWC to be within the predetermined range from the predetermined sheath width PSW.

On the other hand, in response to determining, during the third cycle of the parameter of the LF RF signal 144, that the sheath width SWC lies within the predetermined range from the predetermined sheath width PSW, the processor 118 does not modify the parameter value LPRB to the parameter value LPRC and does not modify frequency value LFB to the frequency value LFC. To illustrate, when the frequency value LFB of the LF RF signal 144 is not changed to the frequency value LFBC and the parameter value LPRB of the LF RF signal 144 is not changed to the parameter value LPRC, the sheath width SWC is not modified. The sheath width SWC is not modified during the third cycle of the parameter of the LF RF signal 144 and the sheath width SWC is within the predetermined range from the predetermined sheath width PSW.

It should be noted that the processor 118 determines a time duration of each cycle of the parameter of the LF RF signal 144. For example, the processor 118 determines the time duration of each cycle of the parameter of the RF signal 144 based on the voltage signal that is received from the probe 170. To illustrate, the processor 118 receives the voltage signal measured by the probe 170 and applies a Fourier Transform to the voltage signal to convert the voltage signal from a time domain to a frequency domain. The processor 118 identifies from the voltage signal in the frequency domain, a low frequency range having low frequencies of the LF RF generator 102 and a high frequency range having high frequencies of the HF RF generator 104 by distinguishing the low frequencies from the high frequencies in the voltage signal. The processor 118 determines that the frequency tuning ranges for the 100 kHz RF generator, the 400 kHz RF generator, and the 2 MHz RF generator are examples of the low frequency range, and the frequency tuning ranges for the 13.56 MHz RF generator, the 27 MHz RF generator, and the 60 MHz RF generator are examples of the high frequency range to distinguish the low frequencies from the high frequencies. The low frequency range identified from the voltage signal measured by the probe 170 is sometimes referred to herein as an LF voltage signal, such as the LF voltage signal 352 (FIG. 3B) and the high frequency range identified from the voltage signal measured by the probe 170 is sometimes referred to herein as an HF voltage signal. The processor 118 determines from the LF voltage signal that the LF voltage signal achieves a negative voltage value at a time t0 and subsequently achieves the same negative voltage value at a time t12 to identify a cycle 1 of the LF voltage signal. Also, the processor 118 determines from the LF voltage signal that the LF voltage signal achieves the negative voltage value at the time t12 and subsequently achieves the same negative voltage value at a time t24 to identify a cycle 2 of the LF voltage signal. The processor 118 determines a time period between the times t0 and t12 as a time duration of the cycle 1 of the parameter of the LF RF signal 144. The processor 118 further determines a time period between the times t12 and t24 as a time duration of the cycle 2 of the parameter of the LF RF signal 144.

As another example of determination of the time duration of each cycle of the parameter of the LF RF signal 144, a voltage probe can be coupled to the output O1 of the LF RF generator 102 to measure an LF voltage signal at the output O1. The voltage probe is coupled to the processor 118. Upon receiving the LF voltage signal from the output O1, the processor 118 determines the cycles 1 and 2 of the LF voltage signal in the same manner as that illustrated in the preceding example except that there is no need to apply the Fourier Transform.

FIG. 3A is a diagram of an embodiment of a table 300 to illustrate a control of the variable of the HF RF signal 146 (FIG. 1A). The variable is controlled based on the width of the bottom plasma sheath 130 (FIG. 1A). The table 300 is generated by the processor 118 and stored in the memory device 120. The table 300 is an example of a database.

The table 300 includes a listing of a width of the bottom plasma sheath 130 that is calculated by the processor 118 based on a signal received from a sensor. For example, the table 300 includes multiple values SW1, SW2, and so on until a value SW(n−1), where n is a positive integer. The table 300 further includes values SWn, SW(n+1) and so on until values SW(p−1) and SWp, where p is a positive integer greater than n. The table 300 also includes the predetermined sheath width PSW. The table 300 includes multiple parameter values HPR1, HPR2, and so on until a parameter value HPR(n−1). The table 300 also includes parameter values HPRn, HPR(n+1) and so on until parameter values HPR(p−1) and HPRp of the HF RF signal 146. The table 300 includes multiple frequency values HF1, HF2, and so on until a frequency value HF(n−1). The table 300 also includes frequency values HFn, HF(n+1) and so on until frequency values HF(p−1) and HFp of the HF RF signal 146.

The processor 118 determines a width of the bottom plasma sheath 130 (FIG. 1A) for each bin of the parameter of the LF RF signal 144. For example, during each bin of the parameter of the LF RF signal 144 that is supplied by the LF RF generator 102 (FIG. 1A), the processor 118 calculates a width of the bottom plasma sheath 130. To illustrate, during a bin 1 of the first cycle of the parameter of the LF RF signal 144, the processor 118 receives a first electrical signal having a first optical emission profile of the bottom plasma sheath 130 from the optical sensor 136 (FIG. 1A). The processor 118 determines, from the first electrical signal, the width SW1 of the bottom plasma sheath 130 from the first electrical signal. Similarly, during a bin 2 of the first cycle of the parameter of the LF RF signal 144, the processor 118 receives a second electrical signal having a second optical emission profile of the bottom plasma sheath 130 from the optical sensor 136. The processor 118 determines, from the second electrical signal, the width SW2 of the bottom plasma sheath 130 from the second electrical signal. Also, during a bin n of the first cycle of the parameter of the LF RF signal 144, the processor 118 receives an $n^{th}$ electrical signal having an $n^{th}$ optical emission profile of the bottom plasma sheath 130 from the optical sensor 136. The processor 118 determines, from the $n^{th}$ electrical signal, the width SWn of the bottom plasma sheath 130 from the $n^{th}$ electrical signal. Also, during a bin p of the first cycle of the parameter of the LF RF signal 144, the processor 118 receives a $p^{th}$ electrical signal having a $p^{th}$ optical emission profile of the bottom plasma sheath 130 from the optical sensor 136. The processor 118 determines the width SWp of the bottom plasma sheath 130 from the $n^{th}$ electrical signal. In the illustration, the probe 170 is coupled to the point 166 (FIG. 1B) on the RF rod of the RF transmission line RFT of the system 100 (FIG. 1A) and the voltage signal from the probe 170 is used by the processor 118 to identify the first cycle of the parameter of the LF RF signal 144.

As another illustration, the processor 118 determines, during the bin 1 of the first cycle of the parameter of the LF RF signal 144, the sheath width SW1 as a statistical value, such as an average or a median, calculated from a first set of sheath widths. The first set of sheath widths is determined by the processor 118 from multiple electrical signals having a first set of optical emission profiles. The first set of optical emission profiles are of the bottom plasma sheath 130 and are determined based on the electrical signals received from the optical sensor 136. The electrical signals are received during the bin 1 of the first cycle of the parameter of the LF RF signal 144. Also, in the illustration, the processor 118 determines, during the bin 2 of the first cycle of the parameter of the LF RF signal 144, the sheath width SW2 as a statistical value calculated from a second set of sheath widths. The second set of sheath widths is determined by the processor 118 from multiple electrical signals having a second set of optical emission profiles of the bottom plasma sheath 130 received from the optical sensor 136. The second set of optical emission profiles are received during the bin 2 of the first cycle of the parameter of the LF RF signal 144.

Upon determining, during the bin 1 of the first cycle of the parameter of the LF RF signal 144, that the sheath width SW1 does not lie within a predetermined range from the predetermined sheath width PSW, the processor 118 changes the variable of the HF RF signal 146 to achieve the predetermined sheath width PSW. For example, in response to determining that the sheath width SW1 does not lie within the predetermined range from the predetermined sheath width PSW, the processor 118 changes a parameter set point, such as a parameter value, of the recipe signal 140 (FIG. 1A) to the parameter value HPR1 to achieve the predetermined sheath width PSW. To illustrate, when the parameter of the HF RF signal 146 changes from the parameter set point to the parameter value HPR1, the sheath width SW1 is modified during the bin 1 of the first cycle of the parameter of the LF RF signal 144 to be within the predetermined range from the predetermined sheath width PSW.

On the other hand, in response to determining, during the bin 1 of the first cycle of the parameter of the LF RF signal 144, that the sheath width SW1 lies within the predetermined range from the predetermined sheath width PSW, the processor 118 does not modify the parameter set point of the recipe signal 140 to the parameter value HPR1. To illustrate, when the parameter set point of the HF RF signal 146 is not changed to the parameter value HPR1, the sheath width SW1 is not modified during the bin 1 of the parameter of the LF RF signal 146 and the sheath width SW1 is within the predetermined range from the predetermined sheath width PSW.

Similarly, as another example, in response to determining that the sheath width SW1 does not lie within the predetermined range from the predetermined sheath width PSW, the processor 118 changes a frequency set point, such as a frequency value, of the recipe signal 140 to the frequency value HF1 to achieve the predetermined sheath width PSW. To illustrate, when the frequency of the HF RF signal 146 changes from the frequency set point to the frequency value HF1, the sheath width SW1 is modified during the bin 1 of the first cycle of the parameter of the LF RF signal 144 to be within the predetermined range from the predetermined sheath width PSW.

On the other hand, in response to determining, during the bin 1 of the first cycle of the parameter of the LF RF signal 144, that the sheath width SW1 lies within the predetermined range from the predetermined sheath width PSW, the processor 118 does not modify the frequency set point of the recipe signal 140 to the frequency value HF1. To illustrate, when the frequency set point of the HF RF signal 146 is not changed to the frequency value HF1, the sheath width SW1 is not modified during the bin 1 of the parameter of the LF RF signal 146 and the sheath width SW1 is within the predetermined range from the predetermined sheath width PSW.

The processor 118 controls, during the bin 1 of the first cycle of the parameter of the LF RF signal 144, the HF RF generator 104 to generate an adjusted HF RF signal having the parameter value HPR1, or the frequency value HF1, or a combination thereof to change the sheath width SW1 to the predetermined sheath width PSW. For example, the processor 118 changes the parameter set point of the parameter of the HF RF signal 146 to the value HPR1 to generate an adjust-parameter recipe signal and sends the adjust-parameter recipe signal to the HF RF generator 104. In response to receiving the adjust-parameter recipe signal having the parameter value HPR1, the HF RF generator 104 generates an adjust-parameter RF signal based on the parameter value HPR1 of the adjust-parameter recipe signal and supplies the adjust-parameter RF signal having the parameter value HPR1 via the RF cable RFC2 to the match 106 (FIG. 1A). Upon receiving the adjust-parameter RF signal having the parameter value HPR1 and the RF signal 144, the match 106 adjusts an impedance of the adjust-parameter RF signal to output a first adjust-parameter modified RF signal. The match 106 combines the first adjust-parameter modified RF signal with the first modified RF signal, which is generated based on the RF signal 144 (FIG. 1A), to output an adjust-parameter combined RF signal and sends the adjust-parameter combined RF signal via the RF transmission line RFT to the ESC 112 to achieve the predetermined sheath width PSW. Continuing with the example, during the bin 1 of the first cycle of the parameter of the LF RF signal 144, after the adjust-parameter combined RF signal is supplied to the ESC 112, the processor 118 receives a modified electrical signal indicating a modified optical emission profile of the bottom plasma sheath 130. In the example, during the bin 1 of the first cycle of the parameter of the LF RF signal 144, the processor 118 determines, from the modified optical emission profile, a modified sheath width and further determines that the modified sheath width is within the predetermined range from the predetermined sheath width PSW.

As another example, the processor 118 changes the frequency set point of the frequency of the HF RF signal 146 to the value HF1 to generate an adjust-frequency recipe signal and sends the adjust-frequency recipe signal to the HF RF generator 104. In response to receiving the adjust-frequency recipe signal having the frequency value HF1, the HF RF generator 104 generates an adjust-frequency RF signal based on the frequency value HF1 of the adjust-frequency recipe signal and supplies the adjust-frequency RF signal having the frequency value HF1 via the RF cable RFC1 to the match 106 (FIG. 1A). Upon receiving the adjust-frequency RF signal having the frequency value HF1 and the RF signal 144, the match 106 adjusts an impedance of the adjust-frequency RF signal to output a first adjust-frequency modified RF signal. The match 106 combines the first adjust-frequency modified RF signal with the first modified RF signal, which is generated based on the RF signal 144 (FIG. 1A), to output an adjusted-frequency combined RF signal and sends the adjusted-frequency combined RF signal via the RF transmission line RFT to the ESC 112 to achieve the predetermined sheath width PSW. Continuing with the example, during the bin 1 of the first cycle of the parameter of the LF RF signal 144, after the adjusted-frequency combined RF signal is supplied to the ESC 112, the processor 118 receives a modified electrical signal indicating a modified optical emission profile of the bottom plasma sheath 130. In the example, during the bin 1 of the first cycle of the parameter of the LF RF signal 144, the processor 118 determines, from the modified optical emission profile, a modified sheath width and further determines that the modified sheath width is within the predetermined range from the predetermined sheath width PSW.

As yet another example, the processor 118 changes the parameter set point of the HF RF signal 146 to the parameter value HPR1 and the frequency set point of the HF RF signal 146 to the value HF1 to generate an adjusted recipe signal and sends the adjusted recipe signal to the HF RF generator 104. In response to receiving the adjusted recipe signal having the values HPR1 and HF1, the HF RF generator 104 generates the adjusted HF RF signal based on the values HPR1 and HF1 of the adjusted recipe signal and supplies the adjusted HF RF signal having the values HPR1 and HF1 via the RF cable RFC2 to the match 106 (FIG. 1A). Upon receiving the adjusted HF RF signal having the values HPR1 and HF1 and the RF signal 144, the match 106 adjusts an impedance of the adjusted HF RF signal to output a first adjusted modified RF signal. The match 106 combines the first adjusted modified RF signal with the first modified RF signal, which is generated based on the RF signal 144 (FIG. 1A), to output an adjusted combined RF signal and sends the adjusted combined RF signal via the RF transmission line RFT to the ESC 112 to change the sheath width SWA to be within the predetermined range from the predetermined sheath width PSW. Continuing with the example, during the bin 1 of the first cycle of the parameter of the LF RF signal 144, after the adjusted combined RF signal is supplied to the ESC 112, the processor 118 receives a modified electrical signal indicating a modified optical emission profile of the bottom plasma sheath 130. In the example, during the bin 1 of the first cycle of the parameter of the LF RF signal 144, the processor 118 determines, from the modified optical emission profile, a modified sheath width and further determines that the modified sheath width is within the predetermined range from the predetermined sheath width PSW.

Similarly, in response to determining, during the bin n of the first cycle of the parameter of the LF RF signal 144, that the sheath width SWn does not lie within the predetermined range from the predetermined sheath width PSW, the processor 118 changes the parameter value HPR(n−1) to the parameter value HPRn, or changes the frequency value HF(n−1) to the frequency value HFn, or changes the parameter value HPR(n−1) to the parameter value HPRn and the frequency value HF(n−1) to the frequency value HFn to achieve the predetermined sheath width PSW. During the bin n of the first cycle of the parameter of the LF RF signal 144, the processor 118 controls the HF RF generator 104 to generate an adjusted HF RF signal having the parameter value HPRn, the frequency value HFn, or having both the values HPRn and HFn to change the sheath width SWn to be within the predetermined range from the predetermined sheath width PSW. For example, during the bin n of the first cycle of the parameter of the LF RF signal 144, after the adjusted HF RF signal is generated by the HF RF generator 104, the processor 118 receives a modified electrical signal indicating a modified optical emission profile of the bottom plasma sheath 130. In the example, during the bin n of the first cycle of the parameter of the LF RF signal 144, the processor 118 determines, from the modified optical emission profile, a modified sheath width and further determines that the modified sheath width is within the predetermined range from the predetermined sheath width PSW.

On the other hand, in response to determining, during the bin n of the first cycle of the parameter of the LF RF signal 144, that the sheath width SWn lies within the predetermined range from the predetermined sheath width PSW, the processor 118 does not modify the frequency value HF(n−1) of the HF RF signal 146 to the frequency value HFn. Also, the processor 118 does not modify the parameter value HPR(n−1) of the HF RF signal 146 to the parameter value HPRn. To illustrate, when the frequency value HF(n−1) of the HF RF signal 146 is not changed to the frequency value HFn and the parameter value HPR(n−1) of the HF RF signal 146 is not changed to the parameter value HPRn, the sheath width SWn is not modified during the bin n of the parameter of the LF RF signal 146 and the sheath width SWn is within the predetermined range from the predetermined sheath width PSW.

Also, in response to determining, during the bin p of the first cycle of the parameter of the LF RF signal 144, that the sheath width SWp does not lie within the predetermined range from the predetermined sheath width PSW, the processor 118 changes the parameter value HPR(p−1) to the parameter value HPRp, or changes the frequency value HF(p−1) to the frequency value HFp, or changes the parameter value HPR(p−1) to the parameter value HPRp and the frequency value HF(p−1) to the frequency value HFp to achieve the predetermined sheath width PSW. During the bin p of the first cycle of the parameter of the LF RF signal 144, the processor 118 controls the HF RF generator 104 to generate an adjusted HF RF signal having the parameter value HPRp or the frequency value HFp, or having both the values HPRp and HFp to change the sheath width SWp to be within the predetermined range from the predetermined sheath width PSW. For example, during the bin p of the first cycle of the parameter of the LF RF signal 144, after the adjusted HF RF signal is generated by the HF RF generator 104, the processor 118 receives a modified electrical signal indicating a modified optical emission profile of the bottom plasma sheath 130. In the example, during the bin p of the first cycle of the parameter of the LF RF signal 144, the processor 118 determines, from the modified optical emission profile, a modified sheath width and further determines that the modified sheath width is within the predetermined range from the predetermined sheath width PSW.

On the other hand, in response to determining, during the bin p of the first cycle of the parameter of the LF RF signal 144, that the sheath width SWp lies within the predetermined range from the predetermined sheath width PSW, the processor 118 does not modify the frequency value HF(p−1) of the HF RF signal 146 to the frequency value HFp and does not modify the parameter value HPR(p−1) of the HF RF signal 146 to the parameter value HPRp. To illustrate, when the frequency value HF(p−1) of the HF RF signal 146 is not changed to the frequency value HFp and the parameter value HPR(p−1) of the HF RF signal 146 is not changed to the parameter value HPRp, the sheath width SW(p−1) is not modified during the bin p of the parameter of the LF RF signal 144 and the sheath width Swp is within the predetermined range from the predetermined sheath width PSW.

FIG. 3B is an embodiment of a graph 350 to illustrate the bins 1 through p during the first cycle of the parameter of the LF RF signal 144 (FIG. 1A). The graph 350 plots the voltage, such as the LF voltage signal 352 versus time t. The LF voltage signal 352 is representative of a voltage of the LF RF signal 144 generated by the LF RF generator 102 (FIG. 1A). For example, the processor 118 (FIG. 1A) determines the LF voltage signal 352 from the voltage that is measured by the probe 170.

The voltage of the LF voltage signal 352 is plotted on a y-axis and the time t is plotted on an x-axis. The time t includes times t0, t1, t2, t3, t4, t5, t6, t7, t8, t9, and t10. The time t includes a time t11, a time t12, a time t13, a time t14, a time t15 and so on until times t23 and t24. A time period between any two consecutive times on the x-axis is equal. For example, a time duration between the times t0 and t1 is equal to a time duration between the times t1 and t2. The voltage signal 352 is illustrated in the graph 350 using dashed lines. The graph 350 further includes a voltage 354 of the bottom plasma sheath 130 (FIG. 1A). The voltage 354 is illustrated in the graph 350 using a solid line. It should be noted that the voltage signal 352 and the voltage 354 are offset from a voltage of zero by a negative voltage value, which is illustrated as −Vdc.

The processor 118 divides each cycle of the LF voltage signal 352 into a predetermined number of the bins 1 through p. For example, after identifying each cycle of the LF voltage signal 352, the processor 118 divides the cycle 1 of the LF voltage signal 352 into the bins 1 through p. The processor 118 also divides the cycle 2 of the LF voltage signal 352 into the bins 1 through p. To illustrate, a time period between a time t0 of the cycle 1 of the LF voltage signal 352 and a time t12 of the cycle 1 of the LF voltage signal 352 is divided by the processor 118 into the bins 1 through p and a time period between the time t12 of the cycle 2 and a time 24 of the cycle 2 is divided by the processor 118 into the bins 1 through p.

The bin 1 extends from the time t0 to the time t1 and the bin 2 extends from the time t1 to the time t2. A bin (n−1) extends from the time t4 to the time t5. A bin n extends from the time t5 to the time t6 and a bin (n+1) extends from the time t6 to the time t7. A bin (p−1) extends from the time t10 to the time t11 and a bin p extends from the time t11 to the time t12.

In one embodiment, each bin is of an equal time period. For example, all bins of the parameter of the LF RF signal 144 extend for equal time periods. To illustrate, the bin 1 of the cycle 1 of the parameter of the LF RF signal extends for a first time period from the time t0 to the time t1. Also, the bin 2 of the cycle 1 of the parameter of the LF RF signal extends for a second time period from the time t1 to the time t2. The first time period is equal to the second time period. As another illustration, the bin (n−1) of the cycle 1 of the parameter of the LF RF signal extends for a first time period from the time t4 to the time t5. Also, the bin n of the cycle 1 of the parameter of the LF RF signal extends for a second time period from the time t5 to the time t6. The first time period is equal to the second time period. As yet another illustration, the bin (p−1) of the cycle 1 of the parameter of the LF RF signal extends for a first time period from the time t10 to the time t11. Also, the bin p of the cycle 1 of the parameter of the LF RF signal extends for a second time period from the time t11 to the time t12. The first time period is equal to the second time period.

In an embodiment, the negative offset −Vdc is not applied to the voltage signal 352. In the embodiment, the voltage signal 352 has the voltage of zero at the times t0, t12, and t24.

In an embodiment, the processor 118 controls the HF RF generator 104, during one or more of the bins 1 through n until corresponding one or more of the sheath widths SW1 through SWn are within the predetermined range from the predetermined sheath width PSW. For example, the processor 118 controls frequency values, or power values, or a combination thereof of the HF RF signal 146 until the sheath widths SW1 through SWn are within the predetermined range from the predetermined sheath width PSW. To illustrate, the processor 118 increases the power values of the HF RF signal 146 during the bins 1 through n of the voltage signal 352 to achieve the predetermined sheath width PSW. As another illustration, the processor 118 decreases the power values of the HF RF signal 146 during the bins 1 through n of the voltage signal 352 to achieve the predetermined sheath width PSW. As yet another example, the processor 118 maintains the power values of the HF RF signal 146 as constant during the bins 1 through n of the voltage signal 352 to maintain the predetermined sheath width PSW. It should be noted that the voltage signal 352 has values greater than the negative potential −Vdc during the bins 1 through n.

In an embodiment, the processor 118 controls the HF RF generator 104, during one or more of the bins (n+1) through p until corresponding one or more of the sheath widths SW(n+1) through SWp are within the predetermined range from the predetermined sheath width PSW. For example, the processor 118 controls frequency values, or power values, or a combination thereof of the HF RF signal 146 until the sheath widths SW(n+1) through SWp are within the predetermined range from the predetermined sheath width PSW. To illustrate, the processor 118 increases the power values of the HF RF signal 146 during the bins (n+1) through p of the voltage signal 352 to achieve the predetermined sheath width PSW. As another illustration, the processor 118 decreases the power values of the HF RF signal 146 during the bins (n+1) through p of the voltage signal 352 to achieve the predetermined sheath width PSW. As yet another example, the processor 118 maintains the power values of the HF RF signal 146 as constant during the bins (n+1) through p of the voltage signal 352 to maintain the predetermined sheath width PSW. It should be noted that the voltage signal 352 has values lower than the negative potential −Vdc during the bins (n+1) through p.

In one embodiment, the processor 118 controls the HF RF generator 104, during one or more bins that occur during a negative transition of the voltage signal 352. For example, the processor 118 controls the HF RF generator 104, during one or more of a bin (n−2) of the cycle 1, the bin (n−1) of the cycle 1, the bin n of the cycle 1, the bin (n+1) of the cycle 1, a bin (n+2) of the cycle 1, and a bin (n+3) of the cycle 1 until corresponding one or more of a sheath width SW(n−2), the sheath width (n−1), the sheath width n, the sheath width SW(n+1), a sheath width SW(n+2), and a sheath width SW(n+3) are within the predetermined range from the predetermined sheath width PSW. To illustrate, the processor 118 controls frequency values, or power values, or a combination thereof of the HF RF signal 146 until the sheath widths SWn and SW(n+1) are within the predetermined range from the predetermined sheath width PSW. To further illustrate, the processor 118 increases the power values of the HF RF signal 146 during the bins (n+1) and n of the voltage signal 352 to achieve the predetermined sheath width PSW. As another further illustration, the processor 118 decreases the power values of the HF RF signal 146 during the bins (n+1) and n of the voltage signal 352 to achieve the predetermined sheath width PSW. As yet another further illustration, the processor 118 maintains the power values of the HF RF signal 146 as constant during the bins (n+1) and n of the voltage signal 352 to maintain the predetermined sheath width PSW. It should be noted that the bin (n−2) extends for a time period that starts at the time t3 and ends at the time t4. The bin (n+2) extends for a time period that starts at the time t7 and ends at the time t8. The bin (n+3) extends for a time period that starts at the time t8 and ends at the time t9.

It should also be noted that the voltage signal 352 transitions periodically from a value V1 to a value −V1. The value V1 is greater than the voltage of zero of the voltage signal 352. The transition from the value V1 to the negative value −V1 is an example of the negative transition. As an example, the negative transition from the value V1 to the value −V1 includes a time period, which includes the bin (n−2), the bin (n−1), the bin n, the bin (n+1), a bin (n+2), and the bin (n+3).

In one embodiment, the processor 118 controls the HF RF generator 104, during one or more bins that occur during a positive transition of the voltage signal 352. For example, the processor 118 controls the HF RF generator 104, during one or more of a bin (p−2) of the cycle 1, the bin (p−1) of the cycle 1, the bin p of the cycle 1, a bin 1 of the cycle 2, a bin 2 of the cycle 2, and a bin 3 of the cycle 2 until corresponding one or more of a sheath width SW(p−2) during the cycle 1, the sheath width SW(p−1) during the cycle 1, the sheath width p during the cycle 1, a sheath width SW11 during the cycle 2, a sheath width SW12 during the cycle 2, and a sheath width SW13 during the cycle 2 are within the predetermined range from the predetermined sheath width PSW. To illustrate, the processor 118 controls frequency values, or power values, or a combination thereof of the HF RF signal 146 until the sheath width SWp during the cycle 1 and the sheath width SW11 during the cycle 2 are within the predetermined range from the predetermined sheath width PSW. To further illustrate, the processor 118 increases the power values of the HF RF signal 146 during the bin p of the cycle 1 and the bin 1 of the cycle 2 of the voltage signal 352 to achieve the predetermined sheath width PSW. As another further illustration, the processor 118 decreases the power values of the HF RF signal 146 during the bin p of the cycle 1 and the bin 1 of the cycle 2 of the voltage signal 352 to achieve the predetermined sheath width PSW. As yet another further illustration, the processor 118 maintains the power values of the HF RF signal 146 as constant during the p of the cycle 1 and the bin 1 of the cycle 2 of the voltage signal 352 to maintain the predetermined sheath width PSW. It should be noted that the bin (p−2) of the cycle 1 of the voltage signal 352 extends for a time period that starts at the time t9 and ends at the time t10. The bin 1 of the cycle 2 extends for a time period that starts at the time t12 and ends at the time t13. The bin 2 of the cycle 2 extends for a time period that starts at the time t13 and ends at the time t14. The bin 3 of the cycle 2 extends for a time period that starts at the time t14 and ends at the time t15.

It should also be noted that the voltage signal 352 transitions periodically from the value −V1 to the value V1. The transition from the negative value −V1 to the positive value V1 is an example of the positive transition. As an example, the positive transition from the value −V1 to the value V1 includes a time period, which includes the bin (p−2) of the cycle 1, the bin (p−1) of the cycle 1, the bin p of the cycle 1, the bin 1 of the cycle 2, the bin 2 of the cycle 2, and the bin 3 of the cycle 2.

In one embodiment, the processor 118 modifies the variable of the HF RF signal 146 during a bin 1 of the second cycle of the parameter of the LF RF signal 144 instead of modifying the variable of the HF RF signal 146 during the bin 1 of the first cycle of the parameter of the LF RF signal 144. The variable is modified to achieve the predetermined sheath width PSW. The variable is modified after determining, during the bin 1 of the first cycle of the parameter of the LF RF signal 144, that the sheath width SW1 does not lie within the predetermined range from the predetermined sheath width PSW. For example, in response to determining that the sheath width SW1 does not lie within the predetermined range from the predetermined sheath width PSW, the processor 118 changes the parameter set point of the recipe signal 140 (FIG. 1A) to the parameter value HPR1 during the bin 1 of the second cycle of the parameter of the LF RF signal 144 to achieve the predetermined sheath width PSW. To illustrate, when the parameter of the HF RF signal 146 changes from the parameter set point to the parameter value HPR1 during the bin 1 of the second cycle of the parameter of the LF RF signal 144, the sheath width SW1 is modified during the bin 1 of the second cycle of the parameter of the LF RF signal 144 to be within the predetermined range from the predetermined sheath width PSW.

On the other hand, in response to determining, during the bin 1 of the first cycle of the parameter of the LF RF signal 144, that the sheath width SW1 lies within the predetermined range from the predetermined sheath width PSW, the processor 118 does not modify, during the bin 1 of the second cycle of the parameter of the LF RF signal 144, the parameter set point of the recipe signal 140 to the parameter value HPR1. To illustrate, when the parameter set point of the HF RF signal 146 is not changed to the parameter value HPR1, the sheath width SW1 is not modified during the bin 1 of second cycle of the parameter of the LF RF signal 146 and the sheath width SW1 is within the predetermined range from the predetermined sheath width PSW.

Similarly, as another example, in response to determining that the sheath width SW1 does not lie within the predetermined range from the predetermined sheath width PSW, the processor 118 changes a frequency set point, such as a frequency value, of the recipe signal 140 to the frequency value HF1 during the bin 1 of the second cycle of the parameter of the LF RF signal 144 to achieve the predetermined sheath width PSW during the bin 1 of the second cycle of the parameter of the LF RF signal 144. To illustrate, when the frequency of the HF RF signal 146 changes from the frequency set point to the frequency value HF1 during the bin 1 of the second cycle of the parameter of the LF RF signal 144, the sheath width SW1 is modified during the bin 1 of the second cycle of the parameter of the LF RF signal 144 to be within the predetermined range from the predetermined sheath width PSW.

On the other hand, in response to determining, during the bin 1 of the first cycle of the parameter of the LF RF signal 144, that the sheath width SW1 lies within the predetermined range from the predetermined sheath width PSW, the processor 118 does not modify, during the bin 1 of the second cycle of the parameter of the LF RF signal 144, the frequency set point of the recipe signal 140 to the frequency value HF1. To illustrate, when the frequency set point of the HF RF signal 146 is not changed to the frequency value HF1 during the bin 1 of the second cycle of the parameter of the LF RF signal 144, the sheath width SW1 is not modified during the bin 1 of the second cycle of the parameter of the LF RF signal 144 and the sheath width SW1 is within the predetermined range from the predetermined sheath width PSW. The processor 118 controls, during the bin 1 of the second cycle of the parameter of the LF RF signal 144, the HF RF generator 104 to generate an adjusted HF RF signal having the parameter value HPR1, or the frequency value HF1, or a combination thereof to change the sheath width SW1 to the predetermined sheath width PSW in the same manner as that described above for controlling the HF RF generator 104 during the bin 1 of the first cycle of the parameter of the LF RF signal 144.

Similarly, the processor 118 modifies the variable of the HF RF signal 146 during a bin p of the second cycle of the parameter of the LF RF signal 144 instead of modifying the variable of the HF RF signal 146 during the bin p of the first cycle of the parameter of the LF RF signal 144. The variable is modified to achieve the predetermined sheath width PSW. The variable is modified after determining, during the bin p of the first cycle of the parameter of the LF RF signal 144, that the sheath width SWp does not lie within a predetermined range from the predetermined sheath width PSW. For example, in response to determining that the sheath width SWp does not lie within the predetermined range from the predetermined sheath width PSW, the processor 118 changes the parameter value HPR(p−1) of the recipe signal 140 (FIG. 1A) to the parameter value HPRp during the bin p of the second cycle of the parameter of the LF RF signal 144 to achieve the predetermined sheath width PSW. To illustrate, when the parameter of the HF RF signal 146 changes from the parameter value HPR(p−1) to the parameter value HPRp during the bin p of the second cycle of the parameter of the LF RF signal 144, the sheath width SWp is modified during the bin p of the second cycle of the parameter of the LF RF signal 144 to be within the predetermined range from the predetermined sheath width PSW.

On the other hand, in response to determining, during the bin p of the first cycle of the parameter of the LF RF signal 144, that the sheath width SWp lies within the predetermined range from the predetermined sheath width PSW, the processor 118 does not modify, during the bin p of the second cycle of the parameter of the LF RF signal 144, the parameter value HPR(p−1) of the recipe signal 140 to the parameter value HPRp. To illustrate, when the parameter set point of the HF RF signal 146 is not changed to the parameter value HPRp, the sheath width SWp is not modified during the bin p of second cycle of the parameter of the LF RF signal 144 and the sheath width SWp is within the predetermined range from the predetermined sheath width PSW.

Similarly, as another example, in response to determining that the sheath width SWp does not lie within the predetermined range from the predetermined sheath width PSW, the processor 118 changes the frequency value HF(p−1) of the recipe signal 140 to the frequency value HFp during the bin p of the second cycle of the parameter of the LF RF signal 144 to achieve the predetermined sheath width PSW during the bin p of the second cycle of the parameter of the LF RF signal 144. To illustrate, when the frequency of the HF RF signal 144 changes from the frequency value HF(p−1) to the frequency value HFp during the bin p of the second cycle of the parameter of the LF RF signal 144, the sheath width SWp is modified during the bin p of the first cycle of the parameter of the LF RF signal 144 to be within the predetermined range from the predetermined sheath width PSW.

On the other hand, in response to determining, during the bin p of the first cycle of the parameter of the LF RF signal 144, that the sheath width SWp lies within the predetermined range from the predetermined sheath width PSW, the processor 118 does not modify, during the bin p of the second cycle of the parameter of the LF RF signal 144, the frequency value HF(p−1) of the recipe signal 140 to the frequency value HFp. To illustrate, when the frequency value HF(p−1) of the HF RF signal 146 is not changed to the frequency value HF1 during the bin p of the second cycle of the parameter of the LF RF signal 144, the sheath width SWp is not modified during the bin p of the second cycle of the parameter of the LF RF signal 144 and the sheath width SWp is within the predetermined range from the predetermined sheath width PSW. The processor 118 controls, during the bin p of the second cycle of the parameter of the LF RF signal 144, the HF RF generator 104 to generate an adjusted HF RF signal having the parameter value HPRp, or the frequency value HFp, or a combination thereof to change the sheath width SWp to the predetermined sheath width PSW in the same manner as that described above for controlling the HF RF generator 104 during the bin p of the first cycle of the parameter of the LF RF signal 144.

FIG. 4 is a diagram of an embodiment of the RF transmission line RFT. The RF transmission line RFT includes an RF rod 402 and an RF sheath 404. An insulator material is placed between the RF rod 402 and the RF sheath 404. The insulator material surrounds the RF rod 402. The RF rod 402 is fabricated from a metal, such as copper or aluminum. The probe 170 is coupled to the RF rod 402 at the point 166. The RF rod 402 provides a forward path for supply of the modified RF signal 148. The RF sheath 404 provides a return path for return of RF power from the plasma chamber 110 (FIG. 1A) via a housing of the impedance matching circuit 106 (FIG. 1A) and the RF cables RFC1 and RFC2 (FIG. 1A) to the RF generators 102 and 104 (FIG. 1A).

FIG. 5 is a diagram of an embodiment of a system 500 to illustrate details of the LF RF generator 102 and of the HF RF generator 104. The system 500 includes the host computer 111, the LF RF generator 102, and the HF RF generator 104.

The LF RF generator 102 includes a digital signal processor (DSP) DSPL, an auto-frequency tuner AFTL, a parameter controller PRTL, a driver DRVRL, and an RF power supply 502. The HF RF generator 104 includes a digital signal processor DSPH. The HF RF generator 104 further includes one auto-frequency tuner (AFT) for each bin and one parameter controller for each bin. For example, the HF RF generator 104 includes multiple auto-frequency tuners AFTbin1, AFTbin2, and so on until an auto-frequency tuner AFTbinp, which are collectively referred to as an auto-frequency tuner AFTH. The HF RF generator 104 also includes multiple parameter controllers PRbin1, PRbin2, and so on until a parameter controller PRbinp, which are collectively referred to as a parameter controller PRH. The HF RF generator 104 includes a driver DRVRH and an RF power supply 504.

Examples of a controller, as used herein, include a processor and a memory device. The processor of the controller is coupled to the memory device of the controller. To illustrate, a controller is a microcontroller or an integrated controller, which is integrated within an ASIC or a PLD. Examples of an auto-frequency tuner, as used herein, include a processor and a memory device. The processor of the auto-frequency tuner is coupled to the memory device of the auto-frequency tuner. Examples of a driver, as used herein, include one or more transistors. The one or more transistors are coupled to each other. An example of an RF power supply includes an electronic oscillator, which is an electronic circuit that produces a periodic, oscillating electronic signal, such as a sine wave.

The digital signal processor DSPL is coupled via the transfer cable 132 to the processor 118. The digital signal processor DSPL is coupled to the auto-frequency tuner AFTL and the parameter controller PRL. The tuner AFTL and the controller PRL are coupled to the driver DRVRL, which is coupled to the RF power supply 502. The RF power supply 502 is coupled to the RF cable RFC1 at the output O1.

Similarly, the digital signal processor DSPH is coupled via the transfer cable 134 to the processor 118. The digital signal processor DSPH is coupled to the auto-frequency tuners AFTbin1 through AFTbinp and the parameter controllers PRbin1 through PRbinp. The controllers PRbin1 through PRbinp are coupled to the driver DRVRH, which is coupled to the RF power supply 504. The RF power supply 504 is coupled to the RF cable RFC2 at the output O2. The auto-frequency tuners AFTbin1 through AFTbinp are coupled to the driver DRVRH.

The processor 118 sends the recipe signal 138 via the transfer cable 132 to the digital signal processor DSPL and sends the recipe signal 140 via the transfer cable 134 to the digital signal processor DSPH. The recipe signal 138 includes the frequency set point and the power set point for the RF signal 144 and the recipe signal 140 includes the frequency set point and the power set point for the RF signal 146.

Upon receiving the recipe signal 138, the digital signal processor DSPL sends the parameter set point for the RF signal 144 to the parameter controller PRL and sends the frequency set point for the RF signal 144 to the auto-frequency tuner AFTL. A processor of the parameter controller PRL stores the parameter set point for the RF signal 144 in a memory device of the parameter controller PRL and a processor of the auto-frequency tuner AFTL stores the frequency set point for the RF signal 144 in a memory device of the auto-frequency tuner AFTL.

The processor 118 generates and sends the trigger signal 142 via the transfer cable 132 to the digital signal processor DSPL. Also, the processor 118 sends the trigger signal 142 via the transfer cable 134 to the digital signal processor DSPH.

Upon receiving the trigger signal 142, the digital signal processor DSPL sends an instruction to the parameter controller PRL and to the auto-frequency tuner AFTL. Upon receiving the instruction from the digital signal processor DSPL, the parameter controller PRL generates a parameter command signal based on the parameter set point for the RF signal 144 and sends the parameter command signal to the driver DRVRL. Similarly, upon receiving the instruction from the digital signal processor DSPL, the auto-frequency tuner AFTL generates a frequency command signal based on the frequency set point for the RF signal 144 and sends the frequency command signal to the driver DRVRL. Upon receiving the parameter command signal and the frequency command signal, the driver DRVRL generates a current signal and sends the current signal to the RF power supply 502. When the current signal is received, the RF power supply 502 generates the LF RF signal 144 having the frequency set point and the parameter set point and outputs the LF RF signal 144 at the output O1 to the RF cable RFC1.

Similarly, upon receiving the recipe signal 140, the digital signal processor DSPH sends the parameter set point for the RF signal 146 to the power controller PRH and sends the frequency set point for the RF signal 146 to the auto-frequency tuner AFTH. A processor of the power controller PRH stores the parameter set point for the HF RF signal 146 in a memory device of the power controller PRH and a processor of the auto-frequency tuner AFTH stores the frequency set point for the HF RF signal 1446 in a memory device of the auto-frequency tuner AFTH.

Moreover, upon receiving the trigger signal 142, the digital signal processor DSPH sends an instruction to the parameter controller PRH and to the auto-frequency tuner AFTH. Upon receiving the instruction from the digital signal processor DSPH, the parameter controller PRH generates a parameter command signal based on the parameter set point for the HF RF signal 146 and sends the parameter command signal to the driver DRVRH. Similarly, upon receiving the instruction from the digital signal processor DSPH, the auto-frequency tuner AFTH generates a frequency command signal based on the frequency set point for the HF RF signal 146 and sends the frequency command signal to the driver DRVRH. Upon receiving the parameter command signal and the frequency command signal, the driver DRVRH generates a current signal and sends the current signal to the RF power supply 504. When the current signal is received, the RF power supply 504 generates the HF RF signal 146 having the frequency set point and the parameter set point and outputs the HF RF signal 146 at the output O2 to the RF cable RFC2.

Upon generating the LF RF signal 144, the processor 118 determines, during a cycle M of the LF RF signal 144, a changed variable value, such as a changed parameter value or a changed frequency value or a combination thereof, to achieve the predetermined sheath width PSW, where M is a positive integer. For example, after generating the LF RF signal 144, the processor 118 determines to change the parameter set point or the frequency set point or a combination thereof, of the LF RF signal 144, provided within the recipe signal 138. As another example, after generating the LF RF signal 144, the processor 118 determines to change the parameter or the frequency or a combination thereof, of the LF RF signal 144, during a cycle, such as the cycle 1 or 2 or 3, of the LF RF signal 144.

The processor 118 sends, during the cycle M of the LF RF signal 144, the changed variable value of the LF RF signal 144 via the transfer cable 132 to the digital signal processor DSPL. Upon receiving the changed variable value of the LF RF signal 144 during the cycle M of the LF RF signal 144, the digital signal processor DSPL determines whether the changed variable value includes a change in the frequency of the LF RF signal 144 or a change in the parameter of the LF RF signal 144 or both. Upon determining, during the cycle M of the LF RF signal 144, that the changed variable value of the LF RF signal 144 includes the change in the parameter of the LF RF signal 144, the digital signal processor DSPL sends the changed parameter value of the LF RF signal 144 to the parameter controller PRL. Also, in response to determining, during the cycle M of the LF RF signal 144, that the changed variable value of the LF RF signal 144 includes the change in the frequency of the LF RF signal 144, the digital signal processor DSPL sends the changed frequency value of the LF RF signal 144 to the auto-frequency tuner AFTL.

Upon receiving, during the cycle M of the LF RF signal 144, the changed parameter value of the LF RF signal 144, the processor of the parameter controller PRL generates, during the cycle M, a changed parameter command signal based on the changed parameter value and sends the changed parameter command signal to the driver DRVRL. Also, upon receiving, during the cycle M of the LF RF signal 144, the changed frequency value of the LF RF signal 144, the processor of the auto-frequency tuner AFTL generates, during the cycle M, a changed frequency command signal based on the changed frequency value and sends the changed frequency command signal to the driver DRVRL.

In response to receiving, during the cycle M of the LF RF signal 144, the changed parameter command signal, or the changed frequency command signal, or both, the driver DRVRL generates, during the cycle M, a changed current signal based on the changed parameter command signal, or the changed frequency command signal, or a combination thereof, and sends the changed current signal to the RF power supply 502. When the changed current signal is received during the cycle M, the RF power supply 502 changes the parameter or the frequency or a combination thereof of the LF RF signal 144 to achieve the predetermined sheath width PSW to output an adjusted LF RF signal.

Also, upon generating the HF RF signal 146, the processor 118 determines, during a bin N, of the cycle M of the parameter of the LF RF signal 144, a changed variable value, such as a changed parameter value or a changed frequency value, to achieve the predetermined sheath width PSW, where the bin N is one of the bins 1 through p. For example, after generating the HF RF signal 146, the processor 118 determines, during the bin 1 of the cycle 1 of the parameter of the LF RF signal 144, a change in the parameter set point or a change in the frequency set point or a combination thereof of the HF RF signal 146 provided within the recipe signal 140. As another example, after generating the HF RF signal 146, the processor 118 determines a change in the parameter or a change in the frequency or a combination thereof of the HF RF signal 146 during the bin N of a cycle of the parameter of the LF RF signal 144.

The processor 118 sends, during the bin N of the cycle M of the parameter of the LF RF signal 144, the changed variable value of the HF RF signal 146 via the transfer cable 134 to the digital signal processor DSPH. Upon receiving the changed variable value of the HF RF signal 146 during the bin N of the LF RF signal 144, the digital signal processor DSPH determines whether the changed variable value includes a change in the frequency of the HF RF signal 146 or a change in the parameter of the HF RF signal 146 or both. Upon determining, during the bin N of the LF RF signal 144, that the changed variable value of the HF RF signal 146 includes the change in the parameter of the HF RF signal 146, the digital signal processor DSPH sends the changed parameter value of the HF RF signal 146 to a corresponding parameter controller PRbinN. The parameter controller PRbinN is one of the parameter controllers PRbin1 through PRbinp. For example, upon determining, during the bin (p−1) of the LF RF signal 144, that the changed variable value of the HF RF signal 146 includes the change in the parameter of the HF RF signal 146, the digital signal processor DSPH sends the changed parameter value of the HF RF signal 146 to the parameter controller PRbin (p−1). As another example, upon determining, during the bin p of the LF RF signal 144, that the changed variable value of the HF RF signal 146 includes the change in the parameter of the HF RF signal 146, the digital signal processor DSPH sends the changed parameter value of the HF RF signal 146 to the parameter controller PRbinp.

Also, in response to determining, during the bin N of the LF RF signal 144, that the changed variable value of the HF RF signal 146 includes the change in the frequency of the HF RF signal 146, the digital signal processor DSPL sends the changed frequency value of the HF RF signal 146 to a corresponding auto-frequency tuner AFTbinN. The auto-frequency tuner AFTbinN is one of the auto-frequency tuners AFTbin1 through AFTbinp. For example, upon determining, during the bin (p−1) of the LF RF signal 144, that the changed variable value of the HF RF signal 146 includes the change in the frequency of the HF RF signal 146, the digital signal processor DSPH sends the changed frequency value of the HF RF signal 146 to the auto-frequency tuner AFTbin(p−1). As another example, upon determining, during the bin p of the LF RF signal 144, that the changed variable value of the HF RF signal 146 includes the change in the parameter of the HF RF signal 146, the digital signal processor DSPH sends the changed frequency value of the HF RF signal 146 to the auto-frequency tuner AFTbinp.

Upon receiving, during the bin N of the LF RF signal 144, the changed parameter value of the HF RF signal 146, the processor of the auto-frequency tuner AFTbinN generates, during the bin N, a changed parameter command signal based on the changed parameter value and sends the changed parameter command signal to the driver DRVRH. Also, upon receiving, during the bin N of the LF RF signal 144, the changed frequency value of the HF RF signal 146, the processor of the auto-frequency tuner AFTbinN generates, during the bin N, a changed frequency command signal based on the changed frequency value and sends the changed frequency command signal to the driver DRVRH.

In response to receiving, during the bin N of the LF RF signal 144, the changed parameter command signal, or the changed frequency command signal, or both, the driver DRVRH generates, during the bin N, a changed current signal based on the changed parameter command signal, or the changed frequency command signal, or a combination thereof, and sends the changed current signal to the RF power supply 504. When the changed current signal is received during the bin N, the RF power supply 504 changes the parameter or the frequency or a combination thereof of the HF RF signal 146 to achieve the predetermined sheath width PSW to output an adjusted HF RF signal.

In one embodiment, instead of a driver, a driver and amplifier system is used within an RF generator. The driver and amplifier system includes a driver and an amplifier. The driver is coupled to the amplifier. A changed current signal is sent from the driver to the amplifier. The amplifier amplifies, such as increases a magnitude of, the changed current signal to output an amplified current signal. The amplifier sends the amplified current signal to an RF power supply that is coupled to the amplifier. The RF power supply generates an RF signal based on the amplified current signal.

It should be noted that the above-described embodiments are described with respect to a plasma sheath width of the bottom plasma sheath 130. In some embodiments, the above-described embodiments apply in a similar manner to other plasma sheath characteristics, such as capacitance and voltage. For example, instead of the predetermined sheath width PSW, a predetermined capacitance of the bottom plasma sheath 130 or a predetermined voltage of the bottom plasma sheath 130 or a predetermined density of the bottom plasma sheath 130 is used.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment, described above, are combined with one or more features of any other embodiment, also described above, without departing from a scope described in various embodiments described in the present disclosure.

It should also be noted that in an embodiment, one or more features from any example, described above, are combined with one or more features of any other example, also described above, without departing from a scope described in various embodiments described in the present disclosure.

It should also be noted that in an embodiment, one or more features from any example, described above, are combined with one or more features of any embodiment, also described above, without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for controlling a variable of a radio frequency (RF) generator, comprising:
receiving a first measurement of a voltage of a plasma sheath formed within a plasma chamber and a first value of a total charge of particles of the plasma sheath, wherein the first value is determined based on an optical signal sensed by an optical sensor;

determining a first capacitance of the plasma sheath from the first measurement of the voltage and the first value of the total charge;

determining whether the first capacitance is equal to a predetermined capacitance; and modifying the variable of the RF generator coupled to the plasma chamber via an impedance matching circuit upon determining that the first capacitance is not equal to the predetermined capacitance, wherein said modifying the variable of the RF generator is performed until it is determined that the first capacitance is equal to the predetermined capacitance.

2. The method of claim 1, wherein the RF generator is a high frequency RF generator, wherein the impedance matching circuit is coupled to the high frequency RF generator and a low frequency RF generator, wherein the low frequency RF generator has a lower frequency of operation than a frequency of operation of the high frequency RF generator, the method further comprising:

receiving a second measurement of the voltage of the plasma sheath and a second value of the total charge of particles of the plasma sheath;

determining a second capacitance of the plasma sheath from the second measurement of the voltage and the second value of the total charge;

determining whether the second capacitance is equal to the predetermined capacitance;

changing the variable of the RF generator upon determining that the second capacitance is not equal to the predetermined capacitance, wherein said changing is performed until it is determined that the second capacitance is equal to the predetermined capacitance, wherein the first measurement is received during a first bin of a cycle of operation of the low frequency RF generator and the second measurement is received during a second bin of the cycle of operation of the low frequency RF generator.

3. The method of claim 2, wherein the second value is determined based on an optical signal sensed by the optical sensor, wherein the plasma chamber has a window and the optical signals are sensed by the optical sensor via the window.

4. The method of claim 2, wherein the first and second measurements of voltage are received from a sensor coupled to an RF transmission line, wherein the RF transmission line couples an output of the impedance matching circuit to an input of the plasma chamber, wherein the sensor is coupled closer to the input of the plasma chamber compared to the output of the impedance matching circuit.

5. The method of claim 1, wherein the total charge of particles is based on a width of the plasma sheath.

6. The method of claim 5, wherein the RF generator is a high frequency RF generator, wherein the impedance matching circuit is coupled to the high frequency RF generator and a low frequency RF generator, wherein the first measurement is taken during a bin of a cycle of operation of the low frequency RF generator.

7. The method of claim 5, wherein the RF generator is a high frequency RF generator, wherein the impedance matching circuit is coupled to the high frequency RF generator and a low frequency RF generator, wherein the first measurement is received during a bin of a cycle of operation of the low frequency RF generator, wherein said modifying is performed during the bin of the cycle of operation of the low frequency RF generator.

8. The method of claim 5, wherein the RF generator is a high frequency RF generator, wherein the impedance matching circuit is coupled to the high frequency RF generator and a low frequency RF generator, wherein the first measurement is received during a bin of a first cycle of operation of the low frequency RF generator, wherein said modifying is performed during a corresponding bin of a second cycle of operation of the low frequency RF generator.

9. The method of claim 8, wherein the second cycle is consecutive to the first cycle.

10. The method of claim 1, wherein the variable is power or voltage or frequency.

11. A computer system for controlling a variable of a radio frequency (RF) generator, comprising:

a processor configured to:

receive a first measurement of a voltage of a plasma sheath formed within a plasma chamber and a first value of a total charge of particles of the plasma sheath, wherein the first value is determined based on an optical signal sensed by an optical sensor;

determine a first capacitance of the plasma sheath from the first measurement of the voltage and the first value of the total charge;

determine whether the first capacitance is equal to a predetermined capacitance; and modify the variable of the RF generator coupled to the plasma chamber via an impedance matching circuit upon determining that the first capacitance is not equal to the predetermined capacitance, wherein the variable of the RF generator is modified until it is determined that the first capacitance is equal to the predetermined capacitance; and a memory device coupled to the processor.

12. The computer system of claim 11, wherein the RF generator is a high frequency RF generator, wherein the impedance matching circuit is coupled to the high frequency RF generator and a low frequency RF generator, wherein the low frequency RF generator has a lower frequency of operation than a frequency of operation of the high frequency RF generator, wherein the processor is configured to:

receive a second measurement of the voltage of the plasma sheath and a second value of the total charge of particles of the plasma sheath;

determine a second capacitance of the plasma sheath from the second measurement of the voltage and the second value of the total charge;

determine whether the second capacitance is equal to the predetermined capacitance; and change the variable of the RF generator upon determining that the second capacitance is not equal to the predetermined capacitance, wherein the variable of the RF generator is changed until it is determined that the second capacitance is equal to the predetermined capacitance, wherein the first measurement is received during a first bin of a cycle of operation of the low frequency RF generator and the second measurement is received during a second bin of the cycle of operation of the low frequency RF generator.

13. The computer system of claim 11, wherein the total charge of particles is based on a width of the plasma sheath.

14. The computer system of claim 13, wherein the RF generator is a high frequency RF generator, wherein the impedance matching circuit is coupled to the high frequency RF generator and a low frequency RF generator, wherein the first measurement is received during a bin of a cycle of operation of the low frequency RF generator, wherein the variable is modified during the bin of the cycle of operation of the low frequency RF generator.

15. The computer system of claim 13, wherein the RF generator is a high frequency RF generator, wherein the impedance matching circuit is coupled to the high frequency RF generator and a low frequency RF generator, wherein the first measurement is received during a bin of a first cycle of operation of the low frequency RF generator, wherein the variable is modified during a corresponding bin of a second cycle of operation of the low frequency RF generator.

16. A plasma system for controlling a variable of a radio frequency (RF) generator, comprising:
the RF generator configured to generate an RF signal, wherein the RF generator has an output;
an impedance matching circuit having an input and an output, wherein the input of the impedance matching circuit is coupled to the output of the RF generator;
a plasma chamber having an input, wherein the input of the plasma chamber is coupled to the output of the impedance matching circuit; and
a controller coupled to the RF generator, wherein the controller is configured to:
receive a first measurement of a voltage of a plasma sheath formed within the plasma chamber and a first value of a total charge of particles of the plasma sheath, wherein the first value is determined based on an optical signal sensed by an optical sensor;
determine a first capacitance of the plasma sheath from the first measurement of the voltage and the first value of the total charge;
determine whether the first capacitance is equal to a predetermined capacitance; and
modify the variable of the RF generator upon determining that the first capacitance is not equal to the predetermined capacitance, wherein the variable of the RF generator is modified until it is determined that the first capacitance is equal to the predetermined capacitance.

17. The plasma system of claim 16, wherein the RF generator is a high frequency RF generator, the plasma system further comprising a low frequency RF generator, wherein the impedance matching circuit is coupled to the low frequency RF generator, wherein the low frequency RF generator has a lower frequency of operation than a frequency of operation of the high frequency RF generator, wherein the controller is configured to:
receive a second measurement of the voltage of the plasma sheath and a second value of the total charge of particles of the plasma sheath;
determine a second capacitance of the plasma sheath from the second measurement of the voltage and the second value of the total charge;
determine whether the second capacitance is equal to the predetermined capacitance; and
change the variable of the RF generator upon determining that the second capacitance is not equal to the predetermined capacitance, wherein the variable of the RF generator is changed until it is determined that the second capacitance is equal to the predetermined capacitance,
wherein the first measurement is received during a first bin of a cycle of operation of the low frequency RF generator and the second measurement is received during a second bin of the cycle of operation of the low frequency RF generator.

18. The plasma system of claim 16, wherein the total charge of particles is based on a width of the plasma sheath, wherein the first measurement is received during a bin of a cycle of operation of the low frequency RF generator, wherein the variable is modified during the bin of the cycle of operation of the low frequency RF generator.

19. The plasma system of claim 16, wherein the first measurement is received during a bin of a first cycle of operation of the low frequency RF generator, wherein the variable is modified during a corresponding bin of a second cycle of operation of the low frequency RF generator, wherein the second cycle of operation is consecutive to the first cycle of operation of the low frequency RF generator.

* * * * *